US012609176B2

(12) United States Patent
Gao et al.

(10) Patent No.: US 12,609,176 B2
(45) Date of Patent: Apr. 21, 2026

(54) MEMORY PROCESSING METHOD BASED ON A SERVER AND APPARATUS, PROCESSOR AND ELECTRONIC DEVICE

(71) Applicant: SUZHOU METABRAIN INTELLIGENT TECHNOLOGY CO., LTD., Suzhou (CN)

(72) Inventors: Honggang Gao, Suzhou (CN); Feng Zhang, Suzhou (CN); Li Wang, Suzhou (CN); Jian Luo, Suzhou (CN)

(73) Assignee: SUZHOU METABRAIN INTELLIGENT TECHNOLOG Y CO., LTD., Suzhou (CN)

( * ) Notice: Subject to any disclaimer, the term of this patent is extended or adjusted under 35 U.S.C. 154(b) by 0 days.

(21) Appl. No.: 19/139,196

(22) PCT Filed: Jun. 28, 2023

(86) PCT No.: PCT/CN2023/103407
§ 371 (c)(1),
(2) Date: Jun. 13, 2025

(87) PCT Pub. No.: WO2024/124862
PCT Pub. Date: Jun. 20, 2024

(65) Prior Publication Data
US 2026/0030097 A1 Jan. 29, 2026

(30) Foreign Application Priority Data
Dec. 14, 2022 (CN) .......................... 202211604326.6

(51) Int. Cl.
*G11C 29/04* (2006.01)
*G06F 11/10* (2006.01)

(52) U.S. Cl.
CPC .......... *G11C 29/04* (2013.01); *G06F 11/1016* (2013.01); *G06F 11/1048* (2013.01); *G06F 11/1076* (2013.01); *G11C 2029/0411* (2013.01)

(58) Field of Classification Search
CPC ............ G06F 11/1016; G06F 11/1048; G06F 11/1076; G11C 29/04; G11C 2029/0411
See application file for complete search history.

(56) References Cited

U.S. PATENT DOCUMENTS

2009/0049335 A1* 2/2009 Khatri ................. G06F 11/2284
714/E11.021
2009/0132876 A1* 5/2009 Freking .................. G11C 29/76
714/723
2019/0042369 A1* 2/2019 Deutsch ................ G06F 3/0673

FOREIGN PATENT DOCUMENTS

CN          107463455 A          12/2017
CN          110489259 A          11/2019
(Continued)

OTHER PUBLICATIONS

The first search report of counterpart CN application No. 202211604326.6 issued on Feb. 3, 2023.
(Continued)

*Primary Examiner* — Steve N Nguyen
(74) *Attorney, Agent, or Firm* — Scully, Scott, Murphy & Presser, P.C.

(57) ABSTRACT

Disclosed are a memory processing method based on a server and apparatus, a processor, and an electronic device. Said method comprises: determining, according to a target flag bit stored in a baseboard management controller, whether to perform a detecting and repairing operation on memories of a target server; when it is determined to perform a detecting and repairing operation on the memories of the target server, acquiring memory hardware parameters of a plurality of memories in the target server, and deter- (Continued)

mining a detection strategy for each memory according to the memory hardware parameters; and detecting each memory according to the detection strategy for each memory to determine a faulty memory, and repairing the faulty memory. The present disclosure solves the technical problem in the related art that when a memory of a server fails, the faulty memory is directly replaced, resulting in a low utilization rate of the memory.

20 Claims, 4 Drawing Sheets

(56) References Cited

FOREIGN PATENT DOCUMENTS

| | | | |
|---|---|---|---|
| CN | 112685241 A | 4/2021 | |
| CN | 113282434 A | 8/2021 | |
| CN | 114780270 A | 7/2022 | |
| CN | 115292113 A | 11/2022 | |
| CN | 115658373 A | 1/2023 | |
| WO | WO-2021185279 A1 * | 9/2021 | ......... G06F 11/0793 |

OTHER PUBLICATIONS

The search report of PCT application No. PCT/CN2023/103407 issued on Sep. 19, 2023.

* cited by examiner

Fig. 2

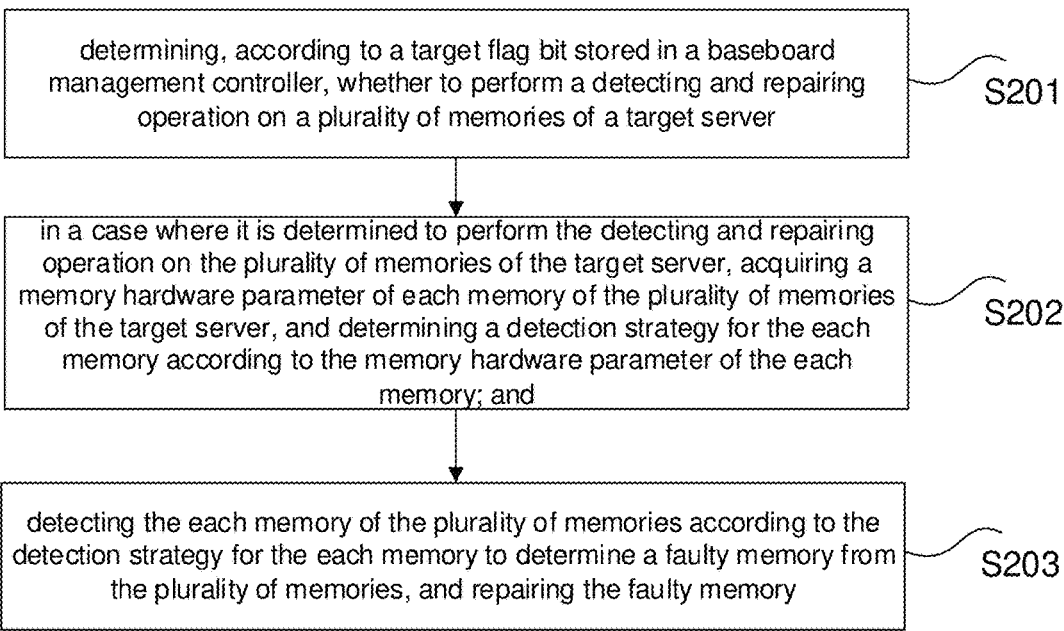

| | |
|---|---|
| determining, according to a target flag bit stored in a baseboard management controller, whether to perform a detecting and repairing operation on a plurality of memories of a target server | S201 |
| in a case where it is determined to perform the detecting and repairing operation on the plurality of memories of the target server, acquiring a memory hardware parameter of each memory of the plurality of memories of the target server, and determining a detection strategy for the each memory according to the memory hardware parameter of the each memory; and | S202 |
| detecting the each memory of the plurality of memories according to the detection strategy for the each memory to determine a faulty memory from the plurality of memories, and repairing the faulty memory | S203 |

Fig. 3

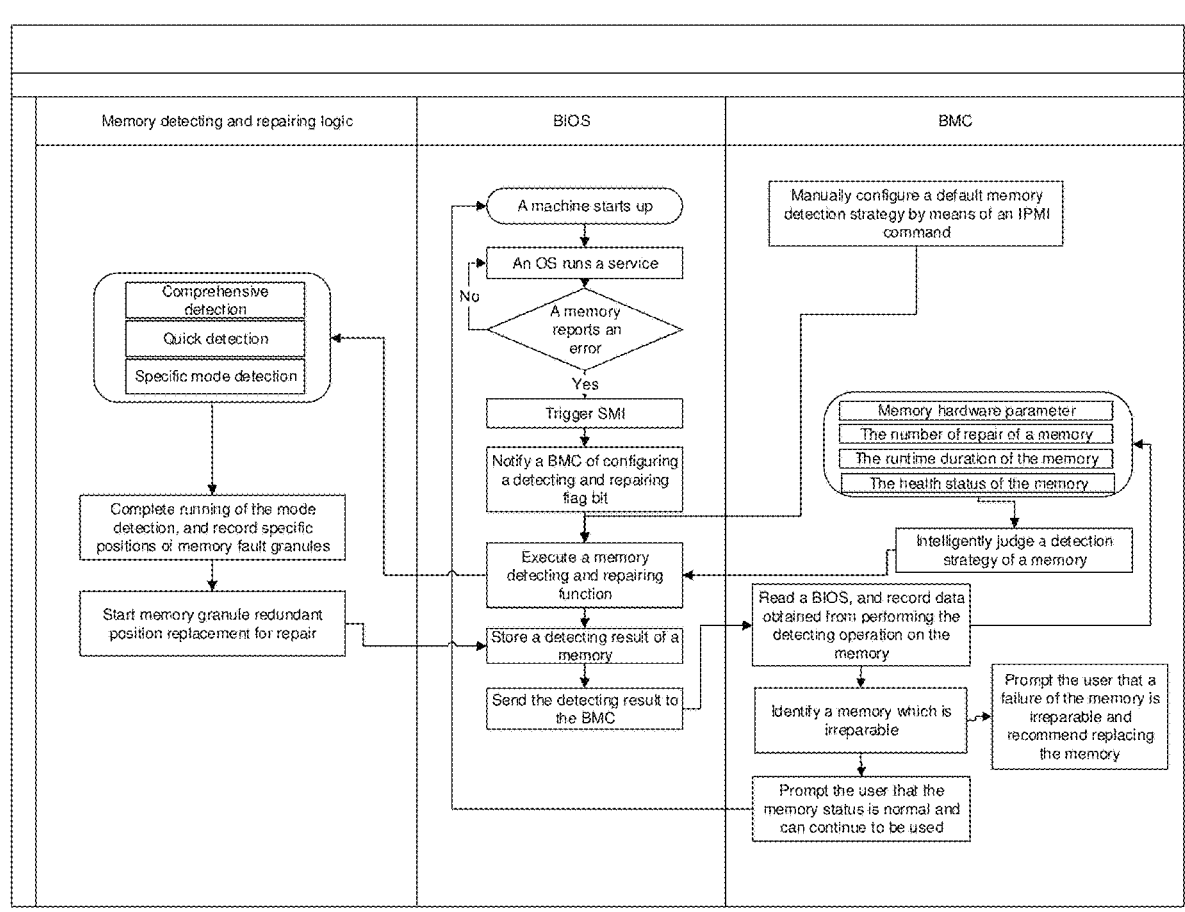

Fig. 6

MEMORY PROCESSING METHOD BASED ON A SERVER AND APPARATUS, PROCESSOR AND ELECTRONIC DEVICE

CROSS-REFERENCE TO RELATED APPLICATION

The present disclosure claims priority to Chinese Patent Application No. 202211604326.6, filed to the China National Intellectual Property Administration on Dec. 14, 2022 and entitled "Memory Processing Method Based on a Server and Apparatus, Processor and Electronic Device", the disclosure of which is incorporated herein by reference in its entirety.

TECHNICAL FIELD

The present disclosure relates to the field of computer technologies, and in particular, to a memory processing method based on a server and apparatus, a processor, and an electronic device.

BACKGROUND

Security and stability are important indicators of server products. A server continuously operates under a high load for a long period of time, and thus there is a high probability that performance of components of a server mainboard deteriorates due to aging, and especially, the failure frequency of memories is higher than that of other components. If a memory fails, the system is easily broken down, and therefore improving the running stability of the memory is of great significance for stable running of the server. In addition, the memory is also one of the most numerous components in the server, and the operation and mainte-nance cost thereof is also a difficulty faced by IDC (Internet data center) machine rooms at present. The failure of memory components generally comprises soft failure and hard failure.

Memory stability and reliability are very important deter-minant factors for stable running of the server. Over 50% of crackdown of a server in current server operation centers is caused by a memory problem. Generally, after a memory fails, operation and maintenance personnel will directly replace the faulty memory, such that the memory cannot be used effectively.

In view of the problems above, no effective solution has been proposed.

SUMMARY

Embodiments of the present disclosure provide a memory processing method based on a server and apparatus, a processor, and an electronic device, so as to at least solve the technical problem in the related art that when a memory of a server fails, the faulty memory is directly replaced, result-ing in a low utilization rate of the memory.

According to a first aspect of embodiments of the present disclosure, provided is a memory processing method based on a server, comprising: determining, according to a target flag bit stored in a baseboard management controller, whether to perform a detecting and repairing operation on a plurality of memories of a target server; in a case where it is determined to perform the detecting and repairing opera-tion on the plurality of memories of the target server, acquiring a memory hardware parameter of each memory of the plurality of memories of the target server, and determin-ing a detection strategy for the each memory according to the memory hardware parameter of the each memory; and detecting the each memory of the plurality of memories according to the detection strategy for the each memory to determine a faulty memory from the plurality of memories, and repairing the faulty memory.

Optionally, the detecting the each memory of the plurality of memories according to the detection strategy for the each memory to determine a faulty memory from the plurality of memories, and repairing the faulty memory, comprise: detecting the each memory of the plurality of memories according to the detection strategy for the each memory to determine the faulty memory from the plurality of memories and a fault bit corresponding to the faulty memory, wherein the fault bit is the smallest storage unit in the faulty memory; and replacing the fault bit corresponding to the faulty memory with a redundant bit in the faulty memory to repair the faulty memory.

Optionally, before the determining, according to a target flag bit stored in a baseboard management controller, whether to perform a detecting and repairing operation on a plurality of memories of a target server, the method further comprises: detecting, while the target server is running, whether a memory in the target server reports an error; in a case where a memory in the target server reports an error, triggering a system management interruption to send data information of the error reported by the memory to the baseboard management controller to configure the target flag bit to be a first preset value by the baseboard management controller; and restarting the target server.

Optionally, the detection strategy at least comprises: a first detection strategy, a second detection strategy and a third detection strategy; and
   the first detection strategy is configured to detect all storage chips of the each memory, the second detection strategy is configured to perform a sampling detection on the storage chips of the each memory, and the third detection strategy is configured to detect the storage chips of the each memory based on a preset detection character and a preset response time.

Optionally, the determining, according to a target flag bit stored in a baseboard management controller, whether to perform a detecting and repairing operation on a plurality of memories of a target server, comprises: reading, by the target server, the target flag bit from the baseboard management controller; and in a case where the target flag bit is the first preset value, determining to perform the detecting and repairing operation on the plurality of memories of the target server.

Optionally, the determining a detection strategy for the each memory according to the memory hardware parameter of the each memory, comprises: reading, according to the memory hardware parameter of the each memory, historical data information of the each memory stored in the baseboard management controller, wherein the historical data informa-tion at least comprises: a runtime duration, a number of repair and a number of repaired bits; and determining the detection strategy for the each memory according to the historical data information of the each memory.

Optionally, the determining a detection strategy for the each memory according to the memory hardware parameter of the each memory, comprises: reading, according to the memory hardware parameter of the each memory, a preset detection strategy stored in the baseboard management controller, wherein the preset detection strategy is a detec-tion strategy configured based on an intelligent platform management interface instruction; and determining the preset detection strategy as the detection strategy for the each memory.

Optionally, the detection strategy is one of the following: a first detection strategy, a second detection strategy, and a third detection strategy, wherein a detecting speed of the first detection strategy is lower than a detecting speed of the second detection strategy, and the third detection strategy is a pre-configured detection strategy.

Optionally, the detecting the each memory of the plurality of memories according to the detection strategy for the each memory to determine the faulty memory from the plurality of memories and a fault bit corresponding to the faulty memory, comprises: in a case where the detection strategy is the first detection strategy, performing a fault detection on each storage chip of the each memory to determine the faulty memory from the plurality of memories and the fault bit corresponding to the faulty memory.

Optionally, the detecting the each memory of the plurality of memories according to the detection strategy for the each memory to determine the faulty memory from the plurality of memories and a fault bit corresponding to the faulty memory, comprises: in a case where the detection strategy is the second detection strategy, performing a sampling detection on storage chips of the each memory to determine the faulty memory from the plurality of memories and the fault bit corresponding to the faulty memory.

Optionally, the detecting the each memory of the plurality of memories according to the detection strategy for the each memory to determine the faulty memory from the plurality of memories and a fault bit corresponding to the faulty memory, comprises: in a case where the detection strategy is the third detection strategy, determining a detection character corresponding to the third detection strategy and a response time corresponding to the third detection strategy, wherein the detection character is configured to be written into the each memory to determine whether each memory has a fault, and the preset response time is the time for writing a character to the each memory; and detecting the each memory according to the detection character and the response time to determine the faulty memory from the plurality of memories and the fault bit corresponding to the faulty memory.

Optionally, the detecting the each memory of the plurality of memories according to the detection strategy for the each memory to determine a faulty memory from the plurality of memories and a fault bit corresponding to the faulty memory, comprises: determining first data and second data, wherein the first data and the second data are configured to be written into the each memory, the second data is obtained by performing a bitwise inversion on the first data; and determining the faulty memory from the plurality of memories and the fault bit corresponding to the faulty memory according to the first data and the second data.

Optionally, determining the faulty memory from the plurality of memories and the fault bit corresponding to the faulty memory according to the first data and the second data, comprises: writing the first data into the each memory, and reading the first data from the each memory after a first preset time to obtain first read data; in a case where the first read data corresponding to a first memory from the plurality of memories is different from the first data, determining the first memory as the faulty memory, and determining the fault bit corresponding to the faulty memory according to the first read data; in a case where the first data is the same as the first read data, writing the second data into the each memory, and reading the second data from the each memory after a second preset time to obtain second read data; and in a case where the second read data corresponding to a second memory from the plurality of memories is different from the second data, determining the second memory as the faulty memory, and determining the fault bit corresponding to the faulty memory according to the second read data.

Optionally, replacing the fault bit corresponding to the faulty memory with a redundant bit in the faulty memory to repair the faulty memory, comprises: judging whether the redundant bit exists in the faulty memory; and in a case where the redundant bit exists in the faulty memory, replacing the fault bit corresponding to the faulty memory with the redundant bit in the faulty memory to repair the faulty memory.

Optionally, after judging whether the redundant bit exists in the faulty memory, the method further comprises: in a case where no redundant bit exists in the faulty memory, indicating that the faulty memory is irreparable.

Optionally, the in a case where the redundant bit exists in the faulty memory, replacing the fault bit corresponding to the faulty memory with the redundant bit in the faulty memory to repair the faulty memory, comprises: determining whether a memory repair criterion corresponding to the faulty memory exists according to the memory hardware parameter of the faulty memory, wherein the memory repair criterion at least comprises: a number of repair being less than a second preset value and/or a number of repaired bits being less than a third preset value; in a case where the memory repair criterion corresponding to the faulty memory exists, judging whether the number of repair and the number of repaired bits corresponding to the faulty memory meet the memory repair criterion; and in a case where the number of repair and the number of repaired bits corresponding to the faulty memory meet the memory repair criterion, replacing the fault bit corresponding to the faulty memory with the redundant bit in the faulty memory to repair the faulty memory.

Optionally, after judging whether the faulty memory meets the memory repair criterion, the method further comprises: in a case where the number of repair and the number of repaired bits corresponding to the faulty memory does not meet the memory repair criterion, indicating that the faulty memory is irreparable.

Optionally, after replacing the fault bit corresponding to the faulty memory with the redundant bit in the faulty memory to repair the faulty memory, the method further comprises: determining a faulty memory which is irreparable, a faulty memory which is repaired, and a non-faulty memory in the plurality of memories; acquiring first data information of the faulty memory which is irreparable, acquiring second data information of the faulty memory which is repaired, and acquiring third data information of the non-faulty memory; and determining memory detecting and repairing results of the target server according to the first data information, the second data information, and the third data information.

Optionally, after determining the memory detecting and repairing results of the target server according to the first data information, the second data information, and the third data information, the method further comprises: sending the memory detecting and repairing result to the baseboard management controller; reading the memory detecting and repairing result by the baseboard management controller, and identifying the faulty memory which is irreparable; and sending the faulty memory which is irreparable to a target object to perform replacement processing on the faulty memory which is irreparable by the target object.

Optionally, after sending the faulty memory which is irreparable to the target object, the method further comprises: storing each of the memory detecting and repairing results into historical data information corresponding to corresponding one memory of the plurality of memories according to the memory hardware parameter of the corresponding one memory.

Optionally, after storing each of the memory detecting and repairing results into historical data information corresponding to corresponding one memory of the plurality of memories, the method further comprises: determining a health status of each memory according to the historical data information corresponding to the each memory to obtain a determination result; and updating a preset detection strategy for the plurality of memories according to the determination result.

According to a second aspect of the embodiments of the present disclosure, further provided is an apparatus processing method based on a server, comprising: a first determination unit, configured to determine, according to a target flag bit stored in a baseboard management controller, whether to perform a detecting and repairing operation on memories of a target server; a first acquisition unit, configured to acquire memory hardware parameters of each memory among a plurality of memories of the target server in a case where it is determined to perform a detecting and repairing operation on the memories of the target server, and determine a detection strategy for each memory according to the memory hardware parameters of each memory; and a repair unit, configured to detect each memory among a plurality of memories of the target server according to the detection strategy for each memory to determine a faulty memory from the plurality of memories of the target server, and configured to repair the faulty memory.

Optionally, the repair unit comprises: a detect sub-unit, configured to the each memory of the plurality of memories according to the detection strategy for the each memory to determine the faulty memory from the plurality of memories and a fault bit corresponding to the faulty memory, wherein the fault bit is the smallest storage unit in the faulty memory; and a replacement sub-unit, configured to the fault bit corresponding to the faulty memory with a redundant bit in the faulty memory to repair the faulty memory.

Optionally, the apparatus further comprises: a detection unit, configured to detect, while the target server is running, whether a memory in the target server reports an error before the determining, according to a target flag bit stored in a baseboard management controller, whether to perform a detecting and repairing operation on a plurality of memories of a target server; a triggering unit, configured to trigger a system management interruption to send data information of the error reported by the memory to the baseboard management controller in a case where a memory in the target server reports an error, to configure the target flag bit to be a first preset value by the baseboard management controller; and a restart unit, configured to restart the target server.

Optionally, the first determination unit comprises: a reading sub-unit, configured to enable the target server to read the target flag bit from the baseboard management controller; and an execution sub-unit, configured to perform the detecting and repairing operation on the plurality of memories of the target server in a case where the target flag bit is the first preset value.

Optionally, the first acquisition unit comprises: a first reading sub-unit, configured to read, according to the memory hardware parameter of the each memory, historical data information of the each memory stored in the baseboard management controller, wherein the historical data information at least comprises: a runtime duration, a number of repair and a number of repaired bits; and a first determination sub-unit, configured to determine the detection strategy for the each memory according to the historical data information of the each memory.

Optionally, the first determination unit further comprises: a second reading sub-unit, configured to read, according to the memory hardware parameter of the each memory, a preset detection strategy stored in the baseboard management controller, wherein the preset detection strategy is a detection strategy configured based on an intelligent platform management interface instruction; and a second determination sub-unit, configured to determine the preset detection strategy as the detection strategy for the each memory.

Optionally, the detection strategy is one of the following: a first detection strategy, a second detection strategy, and a third detection strategy, wherein a detecting speed of the first detection strategy is lower than a detecting speed of the second detection strategy, and the third detection strategy is a pre-configured detection strategy.

Optionally, the detect sub-unit comprises: a first detect module, configured to perform a fault detection on each storage chip of the each memory to determine the faulty memory from the plurality of memories and the fault bit corresponding to the faulty memory in a case where the detection strategy is the first detection strategy.

Optionally, the detect sub-unit comprises: a second detect module, configured to perform a sampling detection on storage chips of the each memory to determine the faulty memory from the plurality of memories and the fault bit corresponding to the faulty memory in a case where the detection strategy is the second detection strategy.

Optionally, the detect sub-unit comprises: a first determination module, configured to determine, in a case where the detection strategy is the third detection strategy, a detection character corresponding to the third detection strategy and a response time corresponding to the third detection strategy, wherein the detection character is configured to be written into the each memory to determine whether each memory has a fault, and the preset response time is the time for writing a character to the each memory; and a third detect module, configured to detect the each memory according to the detection character and the response time to determine the faulty memory from the plurality of memories and the fault bit corresponding to the faulty memory.

Optionally, the detect sub-unit comprises: a second determination module, configured to determine first data and second data, wherein the first data and the second data are configured to be written into the each memory, the second data is obtained by performing a bitwise inversion on the first data; and a third determination module, configured to determine the faulty memory from the plurality of memories and the fault bit corresponding to the faulty memory according to the first data and the second data.

Optionally, the second determination module comprises: a first writing sub-module, configured to write the first data into the each memory, and read the first data from the each memory after a first preset time to obtain first read data; a first determination sub-module, configured to determine, in a case where the first read data corresponding to a first memory from the plurality of memories is different from the first data, the first memory as the faulty memory, and determining the fault bit corresponding to the faulty memory according to the first read data; a second writing sub-module, configured to the second data into the each memory in a case where the first data is the same as the first read data, and reading the second data from the each memory after a second preset time to obtain second read data; and a second determination sub-module, configured to determine, in a case where the second read data corresponding to a second memory from the plurality of memories is different from the second data, the second memory as the faulty memory, and determining the fault bit corresponding to the faulty memory according to the second read data.

Optionally, the replacement sub-unit comprises: a first judgment module, configured to judge whether the redundant bit exists in the faulty memory; and a first replacement module, configured to replace, in a case where the redundant bit exists in the faulty memory, the fault bit corresponding to the faulty memory with the redundant bit in the faulty memory to repair the faulty memory.

Optionally, the apparatus further comprises: a second determination unit, configured to indicate, after judging whether the redundant bit exists in the faulty memory, that the faulty memory is irreparable in a case where no redundant bit exists in the faulty memory.

Optionally, the replacement sub-unit comprises: a fourth determination unit, configured to determine whether a memory repair criterion corresponding to the faulty memory exists according to the memory hardware parameter of the faulty memory, wherein the memory repair criterion at least comprises: a number of repair being less than a second preset value and/or a number of repaired bits being less than a third preset value; a second judgment module, configured to judge, in a case where the memory repair criterion corresponding to the faulty memory exists, whether the number of repair and the number of repaired bits corresponding to the faulty memory meet the memory repair criterion; and a second replacement module, configured to replace, in a case where the number of repair and the number of repaired bits corresponding to the faulty memory meet the memory repair criterion, the fault bit corresponding to the faulty memory with the redundant bit in the faulty memory to repair the faulty memory.

Optionally, the apparatus further comprises: a third determination unit, configured to indicate, after judging whether the faulty memory meets the memory repair criterion, that the faulty memory is irreparable in a case where the number of repair and the number of repaired bits corresponding to the faulty memory does not meet the memory repair criterion.

Optionally, the apparatus further comprises: a fourth determination unit, configured to determine a faulty memory which is irreparable, a faulty memory which is repaired, and a non-faulty memory in the plurality of memories after replacing the fault bit corresponding to the faulty memory with the redundant bit in the faulty memory to repair the faulty memory; a second acquisition unit, configured to acquire first data information of the faulty memory which is irreparable, acquire second data information of the faulty memory which is repaired, and acquire third data information of the non-faulty memory; and a fifth determination unit, configured to determine memory detecting and repairing results of the target server according to the first data information, the second data information, and the third data information.

Optionally, the apparatus further comprises: a first sending unit, configured to send the memory detecting and repairing result to the baseboard management controller after determining the memory detecting and repairing results of the target server according to the first data information, the second data information, and the third data information; an identification unit, configured to the memory detecting and repairing result by the baseboard management controller, and identify the faulty memory which is irreparable; and a second sending unit, configured to send the faulty memory which is irreparable to a target object to perform replacement processing on the faulty memory which is irreparable by the target object.

Optionally, the apparatus further comprises: a storage unit, configured to store, after sending the faulty memory which is irreparable to the target object, each of the memory detecting and repairing results into historical data information corresponding to corresponding one memory of the plurality of memories according to the memory hardware parameter of the corresponding one memory.

Optionally, the apparatus further comprises: an evaluation unit, configured to determine, after storing each of the memory detecting and repairing results into historical data information corresponding to corresponding one memory of the plurality of memories, a health status of each memory according to the historical data information corresponding to the each memory to obtain a determination result; and an update unit, configured to update a preset detection strategy for the plurality of memories according to the determination result.

In order to achieve the described object, according to a third aspect of the present disclosure, provided is a processor, the processor being configured to run a program, wherein when the program is running, the memory processing method based on a server according to any one above.

In order to achieve the described object, according to a fourth aspect of the present disclosure, provided is an electronic device, comprising one or more processors and a storage device, wherein the storage device is configured to store one or more programs to implement the memory processing method based on a server according to any one above.

In the embodiments of the present disclosure, the following steps are adopted: determining, according to a target flag bit stored in a baseboard management controller, whether to perform a detecting and repairing operation on a plurality of memories of a target server; in a case where it is determined to perform the detecting and repairing operation on the plurality of memories of the target server, acquiring a memory hardware parameter of each memory of the plurality of memories of the target server, and determining a detection strategy for the each memory according to the memory hardware parameter of the each memory; and detecting the each memory of the plurality of memories according to the detection strategy for the each memory to determine a faulty memory from the plurality of memories, and repairing the faulty memory, thereby solving the technical problem in the related art that when a memory of a server fails, the faulty memory is directly replaced, resulting in a low utilization rate of the memory. In the present solution, when it is determined that it is necessary to perform a detecting and repairing operation on memories, a detection strategy for each memory is determined by memory hardware parameters; accurate detect of the memory is realized by different detection strategies; and after a faulty memory is determined, a fault module is repaired, thereby achieving the effect of increasing the utilization rate of the memory.

BRIEF DESCRIPTION OF THE DRAWINGS

The drawings illustrated herein are used for providing further understanding of the present disclosure and constitute a part of the present disclosure, and the illustrative embodiments of the present disclosure and illustrations thereof are used for explaining the present disclosure, rather than constituting inappropriate limitation on the present disclosure. In the drawings:

FIG. 2 is a flowchart of a memory processing method based on a server provided according to Embodiment I of the present disclosure;

FIG. 3 is a flowchart of an optional memory processing method based on a server provided according to Embodiment I of the present disclosure;

FIG. 6 is a schematic diagram of a computer terminal provided according to Embodiment III of the present disclosure.

DETAILED DESCRIPTION OF THE EMBODIMENTS

In order to enable a person skilled in the art to understand the solutions of the present disclosure better, hereinafter, the technical solutions in the embodiments of the present disclosure will be described clearly and thoroughly with reference to the accompanying drawings of embodiments of the present disclosure. Obviously, the embodiments as described are only some of embodiments of the present disclosure, rather than all the embodiments. On the basis of the embodiments in the present disclosure, all other embodiments obtained by a person of ordinary skill in the art without any inventive effort shall all fall within the scope of protection of the present disclosure.

It is to be noted that the terms "first", "second", etc. in the description, claims and drawings of the present disclosure are used to distinguish similar objects, and are not necessarily used to describe a specific sequence or a precedence order. It should be understood that the data so used may be interchanged where appropriate such that embodiments of the present disclosure described herein may be implemented in sequences other than those illustrated or described herein. In addition, terms "comprise" and "have" and any variations thereof are intended to cover a non-exclusive inclusion, for example, a process, method, system, product or device which comprises a series of steps or units is not necessarily limited to those steps or units that are clearly listed, but may comprise other steps or units that are not clearly listed or inherent to these process, method, product or device.

According to embodiments of the present disclosure, further provided is a memory processing method based on a server. It should be noted that the steps illustrated in the flowchart of the drawings can be executed in a computer system such as a set of computer-executable instructions, and although a logical order is shown in the flowchart, in some cases, the steps shown or described can be executed in a different order from that described herein.

Figure 1:
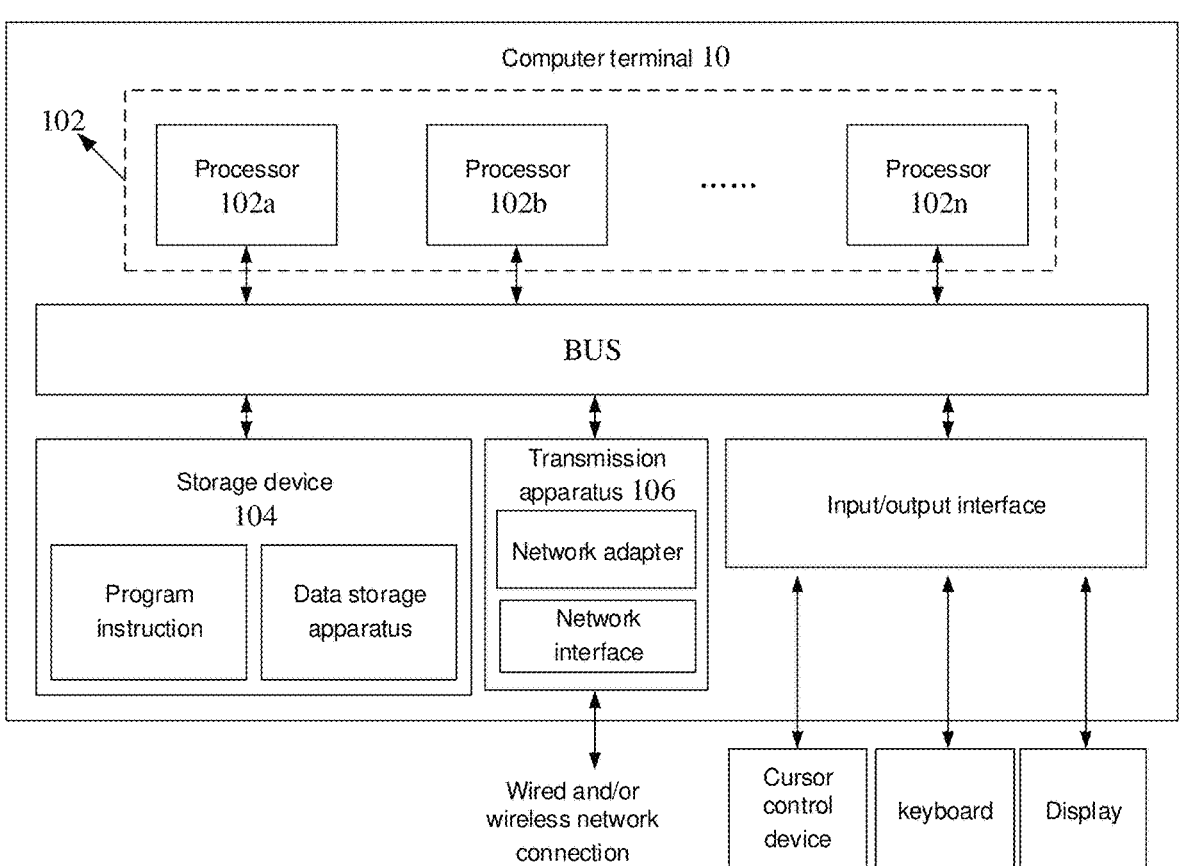
FIG. 1 is a schematic diagram of a computer terminal provided according to Embodiment I of the present disclosure.

The method embodiment provided by Embodiment I of the present disclosure can be executed in a mobile terminal, a computer terminal or a similar computing apparatus. FIG. 1 shows a structural block diagram of hardware of a computer terminal (or mobile device) for implementing the memory processing method based on a server. As shown in FIG. 1, the computer terminal 10 (or mobile device 10) may comprise one or more (shown in the figure using 102*a*, 102*b*, ..., 102*n*) processors 102 (the processors 102 may include but are not limited to processing apparatus such as a micro processor MCU or a programmable logic device, FPGA), a storage device 104 configured to store data, and a transmission module 106 configured for a communication function. In addition, the computer terminal can further comprise: a display, an input/output interface (I/O interface), a universal serial bus (USB) port (which may be included as one of ports of a bus), a network interface, a power supply, and/or a camera. A person of ordinary skill in the art would understand that the structure as shown in FIG. 1 is merely exemplary, and does not limit the structure of the electronic apparatus. For example, the computer terminal 10 may also comprise more or fewer assemblies than those shown in FIG. 1, or have different configurations from that shown in FIG. 1.

It should be noted that the one or more processors 102 and/or other data processing circuitry described above may be generally referred to herein as "data processing circuitry". The data processing circuitry may be embodied wholly or in part in software, hardware, firmware, or any other combination thereof. Additionally, the data processing circuitry may be a single, independent processing module, or may be incorporated wholly or in part into any of the other elements in the computer terminal 10 (or mobile device). As mentioned in the embodiments of the present disclosure, the data processing circuitry is controlled as a processor (e.g. selection of a terminal path of a variable resistor connected to an interface).

The storage device 104 can be configured to store software programs and modules of application software, such as program instructions/data storage apparatus corresponding to the memory processing method based on a server in the embodiments of the present disclosure; and the processor 102 runs the software programs and modules stored in the storage device 104, so as to execute various functional applications and data processing, i.e. implementing the described memory processing method based on a server. The storage device 104 may include a high-speed random access memory, and may also include a non-transitory memory, such as one or more magnetic storage apparatuses, flash memories or other non-transitory solid-state memories. In some examples, the storage device 104 may further include storage devices remotely arranged with respect to the processors 102, and these remote storage devices may be connected to the computer terminal 10 via a network. Examples of the network include, but are not limited to the Internet, an intranet, a local area network, a mobile communication network and combinations thereof.

The transmission apparatus 106 is configured to receive or send data via a network. Optional examples of the network may include a wireless network provided by a communication provider of the computer terminal 10. In one example, the transmission apparatus 106 comprises a network adapter (network interface controller, NIC) that may be connected to other network devices via a base station so as to communicate with the Internet. In one example, the transmission apparatus 106 may be a radio frequency (RF) module which is configured to communicate with the Internet in a wireless manner.

The display may be, for example, a touch-screen liquid crystal display (LCD) which enables a user to interact with a user interface of the computer terminal 10 (or mobile device).

In the running environment above, the present disclosure provides a memory processing method based on a server as shown in FIG. 2. FIG. 2 is a flowchart of a memory processing method based on a server according to Embodiment I of the present disclosure.

Hereinafter, the memory processing method based on a server provided according to Embodiment I of the present disclosure will be introduced. As shown in FIG. 2, the method comprises:

step S201: determining, according to a target flag bit stored in a baseboard management controller, whether to perform a detecting and repairing operation on a plurality of memories of a target server;

step S202: in a case where it is determined to perform the detecting and repairing operation on the plurality of memories of the target server, acquiring a memory hardware parameter of each memory of the plurality of memories of the target server, and determining a detection strategy for the each memory according to the memory hardware parameter of the each memory; and step S203: detecting the each memory of the plurality of memories according to the detection strategy for the each memory to determine a faulty memory from the plurality of memories, and repairing the faulty memory.

Optionally, it is specified whether it is necessary to perform a detecting and repairing operation on the memories of the target server; and by reading the target flag bit stored in the baseboard management controller (BMC), whether to perform a detecting and repairing operation on the memories of the target server is determined.

The BMC (baseboard management controller) implements management functions such as data collection, event recording, error diagnosis, and fault elimination of a server by built-in FW (firmware), and sensors dispersed on a substrate, a system board, and a chassis.

When it is determined that it is necessary to perform a detecting and repairing operation on the memories, memory hardware parameters of the plurality of memories in the target server are acquired by SPD (serial presence detect, serial detect for the presence of a module), wherein the memory hardware parameters may include but are not limited to, information such as a memory identifier. A detection strategy for each memory is determined by the memory hardware parameters.

It should be noted that the detection strategy at least comprises: a first detection strategy, a second detection strategy, and a third detection strategy. The first detection strategy may also be referred to as a comprehensive detection strategy, and the comprehensive detection strategy may detect all storage chips under each memory, but this detection strategy has a long detecting and repairing operation time. Some memories are not used frequently, and thus correspondingly it is also not necessary to maintain these memories every time; and the second detection strategy can also be referred to as a quick detection strategy, and the quick detection strategy can perform sampling detecting on the storage chips in each memory. The third detection strategy may also be referred to as a specific model detection strategy, and a user may perform personalized settings according to some actual requirements, for example, setting a character written into a memory and a response time for writing the character into the memory.

By selecting a reasonable detection strategy, the efficiency and accuracy of detecting and repairing operation on memories can be effectively improved.

After the detection strategy for each memory is determined, each memory is detected by the detection strategy to determine a faulty memory, and the faulty memory is repaired. After memory detect, if there is no hard failure, a client can be notified to continue to use the memory; and if there is hard failure, for example, a failure occurs in certain bits, then redundant bits are used to replace the fault bits by using a PPR (post package repair) technology, so as to repair the faulty memory. PPR (post package repair) is a repair scheme after a memory chip is packaged.

In summary, when it is determined that it is necessary to perform a detecting and repairing operation on the memories, a detection strategy for each memory is determined by memory hardware parameters; accurate detect of the memory is realized by different detection strategies; and after a faulty memory is determined, a fault module is repaired, thereby increasing the utilization rate of the memory. By the described steps, memories having irreparable failures or having risks are screened in a delivery and use process, such that the stability and robustness of the memories are improved, the stability and reliability of server assembly production and the running process of the server are improved, and the cost increase caused by frequent replacement of memories is reduced.

In order to accurately repair a memory, in the memory processing method based on a server provided in Embodiment I of the present disclosure, the detecting the each memory of the plurality of memories according to the detection strategy for the each memory to determine a faulty memory from the plurality of memories, and repairing the faulty memory, comprise: detecting the each memory of the plurality of memories according to the detection strategy for the each memory to determine the faulty memory from the plurality of memories and a fault bit corresponding to the faulty memory, wherein the fault bit is the smallest storage unit in the faulty memory; and replacing the fault bit corresponding to the faulty memory with a redundant bit in the faulty memory to repair the faulty memory.

Optionally, when each memory is detected, a fault bit corresponding to the faulty memory is also accurately determined while the faulty memory is determined. Generally speaking, when a memory is manufactured, some redundant bits are reserved, for example, 10% redundant bits are usually reserved; therefore, after a faulty memory is detected, a fault bit corresponding to the faulty memory is replaced with a redundant bit in the faulty memory, so as to repair the faulty memory. By the described steps, accurate repair of the faulty memory can be achieved.

Since the detecting and repairing operation may consume a certain time cost, in order to reduce time cost, whether a detecting and repairing operation on the memories needs to be performed may be determined in the following manner: detecting, while the target server is running, whether a memory in the target server reports an error; in a case where a memory in the target server reports an error, triggering a system management interruption to send data information of the error reported by the memory to the baseboard management controller to configure the target flag bit to be a first preset value by the baseboard management controller; and restarting the target server.

The determining, according to a target flag bit stored in a baseboard management controller, whether to perform a detecting and repairing operation on a plurality of memories of a target server, comprises: reading, by the target server, the target flag bit from the baseboard management controller; and in a case where the target flag bit is the first preset value, determining to perform the detecting and repairing operation on the plurality of memories of the target server.

Optionally, the target server starts to run, and a service normally runs at the target server; then whether the target server reports an error is detected; if a memory reports an error, system management interruption (SMI) is directly triggered and the baseboard management controller is notified; and error data information of the memory is sent to the baseboard management controller. Upon receiving the error information, the baseboard management controller sets a detect and repair function flag bit (i.e. the target flag bit) as a preset value (for example, as 1). Then, the target server is restarted.

After the target server is restarted, the target server reads the target flag bit from the baseboard management controller; and if the target flag bit is the preset value, detecting and repairing operation on the memories of the target server is performed.

In conclusion, when a memory reports an error, by setting the target flag bit, accurate control of whether to perform memory detect is achieved.

It should be noted that in actual applications, a user may also set to perform memory detect periodically, so as to achieve the effect of improving the memory stability.

In order to accurately match a detection strategy for a memory, in the memory processing method based on a server provided in Embodiment I of the present disclosure, the determining a detection strategy for the each memory according to the memory hardware parameter of the each memory, comprises: reading, according to the memory hardware parameter of the each memory, historical data information of the each memory stored in the baseboard management controller, wherein the historical data information at least comprises: a runtime duration, a number of repair and a number of repaired bits; and determining the detection strategy for the each memory according to the historical data information of the each memory.

Reading, according to the memory hardware parameter of the each memory, a preset detection strategy stored in the baseboard management controller, wherein the preset detection strategy is a detection strategy configured based on an intelligent platform management interface instruction; and determining the preset detection strategy as the detection strategy for the each memory.

Optionally, the detection strategy for each memory is determined in one of the following manners:

Manner I: historical data information of each memory is read from the baseboard management controller by means of the memory hardware parameters, wherein the historical data information includes but is not limited to, a runtime duration, a number of repair and a number of repaired bits. The runtime duration is a time length during which the memory has been used currently; the number of repair refers to the number of times that the memory has been repaired before this detect; and the number of repaired bits refers to the number of smallest storage bits which have been repaired in the memory.

A detection strategy for each memory is determined according to the described data information. For example, if a certain memory is used for the first time, the quick detection strategy may be used; and if a certain memory has been repaired for many times, the comprehensive detection strategy may be used, and the like.

Manner II: the preset detection strategy stored in the baseboard management controller may be read directly according to the memory hardware parameters. It should be noted that the preset detection strategy is a default detection strategy set on the basis of an intelligent platform management interface instruction (IPMI instruction). It should be noted that, the default detection strategy may be further subdivided into a detection strategy in a production stage and a detection strategy in an operation and maintenance stage (namely, a stage of performing a detecting and repairing operation on memories).

In conclusion, by the described manners, a detection strategy can be matched for each memory more reasonably.

In the memory processing method based on a server provided in Embodiment I of the present disclosure, the detection strategy is one of the following: a first detection strategy, a second detection strategy, and a third detection strategy, wherein a detecting speed of the first detection strategy is lower than a detecting speed of the second detection strategy, and the third detection strategy is a pre-configured detection strategy.

The detecting the each memory of the plurality of memories according to the detection strategy for the each memory to determine the faulty memory from the plurality of memories and a fault bit corresponding to the faulty memory, comprises: in a case where the detection strategy is the first detection strategy, performing a fault detection on each storage chip of the each memory to determine the faulty memory from the plurality of memories and the fault bit corresponding to the faulty memory.

The detecting the each memory of the plurality of memories according to the detection strategy for the each memory to determine the faulty memory from the plurality of memories and a fault bit corresponding to the faulty memory, comprises: in a case where the detection strategy is the second detection strategy, performing a sampling detection on storage chips of the each memory to determine the faulty memory from the plurality of memories and the fault bit corresponding to the faulty memory.

The detecting the each memory of the plurality of memories according to the detection strategy for the each memory to determine the faulty memory from the plurality of memories and a fault bit corresponding to the faulty memory, comprises: in a case where the detection strategy is the third detection strategy, determining a detection character corresponding to the third detection strategy and a response time corresponding to the third detection strategy, wherein the detection character is configured to be written into the each memory to determine whether each memory has a fault, and the preset response time is the time for writing a character to the each memory; and detecting the each memory according to the detection character and the response time to determine the faulty memory from the plurality of memories and the fault bit corresponding to the faulty memory.

Optionally, the detection strategy at least comprises: a first detection strategy, a second detection strategy and a third detection strategy. The first detection strategy may also be referred to as a comprehensive detection strategy, and the comprehensive detection strategy may detect all storage chips under each memory, but this detection strategy has a long maintenance time (namely, the time of performing a detecting and repairing operation on memories). Some memories are not used frequently, and thus correspondingly it is also not necessary to maintain these memories every time; and the second detection strategy can also be referred to as a quick detection strategy, and the quick detection strategy can perform sampling detecting on the storage chips in each memory. The third detection strategy may also be referred to as a specific model detection strategy, and a user may perform personalized settings according to some actual requirements, for example, setting a character written into a memory and a response time for writing the character into the memory.

In a case where the detection strategy is the first detection strategy, performing a fault detection on each storage chip of the each memory to determine the faulty memory from the plurality of memories and the fault bit corresponding to the faulty memory;

In a case where the detection strategy is the second detection strategy, performing a sampling detection on storage chips of the each memory to determine the faulty memory from the plurality of memories and the fault bit corresponding to the faulty memory; and In a case where the detection strategy is the third detection strategy, determining a detection character corresponding to the third detection strategy and a response time corresponding to the third detection strategy, wherein the detection character is configured to be written into the each memory to determine whether each memory has a fault, and the preset response time is the time for writing a character to the each memory; and detecting the each memory according to the detection character and the response time to determine the faulty memory from the plurality of memories and the fault bit corresponding to the faulty memory. For example, if the response time is 1 us, after a detection character is written into the memory for 1 us, the detection character is read.

In conclusion, the faulty memory and the fault bit corresponding to the faulty memory can be accurately identified by using the described detection strategies.

In the memory processing method based on a server provided in Embodiment I of the present disclosure, the detecting the each memory of the plurality of memories according to the detection strategy for the each memory to determine a faulty memory from the plurality of memories and a fault bit corresponding to the faulty memory, comprises: determining first data and second data, wherein the first data and the second data are configured to be written into the each memory, the second data is obtained by performing a bitwise inversion on the first data; and determining the faulty memory from the plurality of memories and the fault bit corresponding to the faulty memory according to the first data and the second data.

Determining the faulty memory from the plurality of memories and the fault bit corresponding to the faulty memory according to the first data and the second data, comprises: writing the first data into the each memory, and reading the first data from the each memory after a first preset time to obtain first read data; in a case where the first read data corresponding to a first memory from the plurality of memories is different from the first data, determining the first memory as the faulty memory, and determining the fault bit corresponding to the faulty memory according to the first read data; in a case where the first data is the same as the first read data, writing the second data into the each memory, and reading the second data from the each memory after a second preset time to obtain second read data; and in a case where the second read data corresponding to a second memory from the plurality of memories is different from the second data, determining the second memory as the faulty memory, and determining the fault bit corresponding to the faulty memory according to the second read data.

Optionally, each memory is detected to determine the faulty memory and the fault bit corresponding to the faulty memory, comprises the following step: first data and second data used for memory detect are specified, wherein the first data and the second data are binary code data, and the second data is obtained by performing bitwise inversion on the first data. For example, if the first data is 010101, then the second data is 101010.

Writing the first data into the each memory, and reading the first data from the each memory after a first preset time to obtain first read data. The first preset time is a response time for writing data into the memory, and may be set as actually needed, for example, set as 2-3 us (microsecond). After the first read data is obtained, it is judged whether the first read data is identical with the first data; and if a certain bit is different, it indicates that a fault exists in the current memory, and the memory is directly determined as a faulty memory; and according to the first read data, it is determined which bit of the memory is faulty, that is, the described fault bit of the faulty memory is determined.

If the first read data of a memory is identical with the first data, the second data is written into the memory, and the second data is read from each memory after a second preset time to obtain second read data. The second preset time is a response time for writing data into the memory, and may be set as actually needed, for example, set as 2-3 us (microsecond). After the second read data is obtained, it is judged whether the second read data is identical with the second data; and if a certain bit is different, it indicates that a fault exists in the current memory, and the memory is directly determined as a faulty memory; and according to the second read data, it is determined which bit of the memory is faulty, that is, the described fault bit of the faulty memory is determined.

In conclusion, by writing and reading the first data and the second data, it can be accurately judged whether a memory has a fault, thereby improving the detect accuracy.

The redundant bits in a memory are limited, and thus in the memory processing method based on a server provided in Embodiment I of the present disclosure, replacing the fault bit corresponding to the faulty memory with a redundant bit in the faulty memory to repair the faulty memory, comprises: judging whether the redundant bit exists in the faulty memory; and in a case where the redundant bit exists in the faulty memory, replacing the fault bit corresponding to the faulty memory with the redundant bit in the faulty memory to repair the faulty memory.

In a case where no redundant bit exists in the faulty memory, indicating that the faulty memory is irreparable.

Optionally, it is judged whether an available redundant bit still exists in the current faulty memory, and if an available redundant bit still exists in the faulty memory, the fault bit corresponding to the faulty memory is replaced with the redundant bit in the faulty memory, so as to achieve the purpose of repairing the faulty memory.

In a case where no redundant bit exists in the faulty memory, indicating that the faulty memory is irreparable.

In order to improve the reasonability of repairing a fault model, in the memory processing method based on a server provided in Embodiment I of the present disclosure, in a case where the redundant bit exists in the faulty memory, replacing the fault bit corresponding to the faulty memory with the redundant bit in the faulty memory to repair the faulty memory, comprises: determining whether a memory repair criterion corresponding to the faulty memory exists according to the memory hardware parameter of the faulty memory, wherein the memory repair criterion at least comprises: a number of repair being less than a second preset value and/or a number of repaired bits being less than a third preset value; in a case where the memory repair criterion corresponding to the faulty memory exists, judging whether the number of repair and the number of repaired bits corresponding to the faulty memory meet the memory repair criterion; and in a case where the number of repair and the number of repaired bits corresponding to the faulty memory meet the memory repair criterion, replacing the fault bit corresponding to the faulty memory with the redundant bit in the faulty memory to repair the faulty memory.

In a case where the number of repair and the number of repaired bits corresponding to the faulty memory does not meet the memory repair criterion, indicating that the faulty memory is irreparable.

Optionally, whether a memory repair criterion corresponding to the faulty memory exists in the baseboard management control system is determined by means of the memory hardware parameters of the faulty memory; if the memory repair criterion corresponding to the faulty memory exists, whether the number of repair and the number of repair bits corresponding to the faulty memory meet the memory repair criterion is judged; and if the number of repair and the number of repair bits corresponding to the faulty memory meet the memory repair criterion, the fault bit corresponding to the faulty memory is replaced with the redundant bit in the faulty memory, so as to repair the faulty memory.

It should be noted that the memory repair criterion may be set as actually needed. For example, the memory repair criterion at least comprises: the number of repair being less than a second preset value and/or the number of repair bits being less than a third preset value. The second preset value and the third preset value may be set as actually needed, for example, the second preset value may be as 10 times, and the third preset value may be set as 10, and so on.

If the number of repair and the number of repair bits corresponding to the faulty memory do not meet the memory repair criterion, it indicates that the faulty memory is irreparable.

The memory repair criterion is set to maintain a faulty memory more reasonably. If a certain memory has been repaired for many times, it indicates that an error probability of the memory is too high, which seriously affects normal use of the server; therefore, if the number of repair and the number of repair bits corresponding to the faulty memory do not meet the memory repair criterion, it indicates that the faulty memory is irreparable. By setting the memory repair criterion, memories having poor health status can be pre-screened, thereby improving the running stability of the server.

In the memory processing method based on a server provided in Embodiment I of the present disclosure, after replacing the fault bit corresponding to the faulty memory with the redundant bit in the faulty memory to repair the faulty memory, the method further comprises: determining a faulty memory which is irreparable, a faulty memory which is repaired, and a non-faulty memory in the plurality of memories; acquiring first data information of the faulty memory which is irreparable, acquiring second data information of the faulty memory which is repaired, and acquiring third data information of the non-faulty memory; and determining memory detecting and repairing results of the target server according to the first data information, the second data information, and the third data information.

Optionally, after each memory is detected, detect results are summarized to determine the irreparable faulty memory, the repaired faulty memory and the non-faulty memory in the plurality of memories, and first data information of the irreparable faulty memory, second data information of the repaired faulty memory, and third data information of the non-faulty memory are acquired; and by summarizing the first data information, the second data information, and the third data information, a memory detecting and repairing result of the target server each time is obtained. The first data information, the second data information, and the third data information include but are not limited to information such as an identifier and a detect result of the memory.

In the memory processing method based on a server provided in Embodiment I of the present disclosure, after determining the memory detecting and repairing results of the target server according to the first data information, the second data information, and the third data information, the method further comprises: sending the memory detecting and repairing result to the baseboard management controller; reading the memory detecting and repairing result by the baseboard management controller, and identifying the faulty memory which is irreparable; and sending the faulty memory which is irreparable to a target object to perform replacement processing on the faulty memory which is irreparable by the target object.

Storing each of the memory detecting and repairing results into historical data information corresponding to corresponding one memory of the plurality of memories according to the memory hardware parameter of the corresponding one memory.

Determining a health status of each memory according to the historical data information corresponding to the each memory to obtain a determination result; and updating a preset detection strategy for the plurality of memories according to the determination result.

After obtaining the memory detect result, the memory detect result is sent to the baseboard management controller, and the baseboard management controller reads the memory detecting and repairing result, and identify the irreparable faulty memory and memories that can also be normally used; and with regard to the irreparable faulty memory, relevant information will be sent to the target object (i.e. a user), so as to remind the user to perform replacement processing.

The baseboard management controller also stores the memory detecting and repairing result into the historical data information corresponding to each memory, so as to take same as a reference during subsequent maintenance of the faulty memory; and the baseboard management controller evaluates the health status of each memory according to the historical data information corresponding to each memory, to obtain an evaluation result; and then the preset detection strategy for each memory is updated according to the evaluation result. For example, if a certain memory fails continuously, the detection strategy therefor is set as the comprehensive detection strategy.

In some optional embodiments, the detecting and repairing operation on the memories of the server may be implemented by using the flowchart as shown in FIG. 3. Optionally, BIOS (basic input output system) codes are set, and the BIOS codes comprise a memory body robustness pre-identification module and a memory repair module. As shown in FIG. 3, the server starts up, the BIOS codes run, and memories initialize. The BIOS acquires memory hardware parameters via SPD. Machines under an OS run a service normally; whether a memory reports an error is detected, and if a memory reports an error, SMI is triggered to notify the BMC; the BMC records memory error information, and resets detect and repair functions which need to be started during next restart; and the server performs memory detect and repair functions after startup, the detection strategy may be automatically and intelligently selected by the BMC acquiring memory status information, and may also be formulated by a customer by an IPMI command. After the detection strategy is selected, the memory is detected by the corresponding strategy; and generally, comprehensive detect covers the finest granularity, and detects all memory banks and all chips under the memory banks, so as to help find out an intermittent fault risk of the memory. However, this mode takes a long detect time.

In addition, there are a quick detection strategy and a specific mode detection strategy, and memory granule bits which may have a fault or have a poor health status can be identified according to actual situations. After memory detect, if there is no hard failure, a client can be notified to continue to use the memory; and if there is hard failure, for example, a failure occurs in certain bits, then redundant bits are used to replace the fault bits by using a PPR technology. Both the number of replaceable bits and the number of replaceable times of the memory can be set by the BMC. After the memory detect and repair functions are completed, the BIOS sends a relevant result to the BMC and store same in a log. The BMC analyzes the detect and repair result, judges the health status of the memory, and notifies the user of replacement or continuing to use the memory; and if the user continues to use the memory, the status of the memory will also be tracked as a parameter for subsequent detection strategy judgment.

Figures 4, 5:
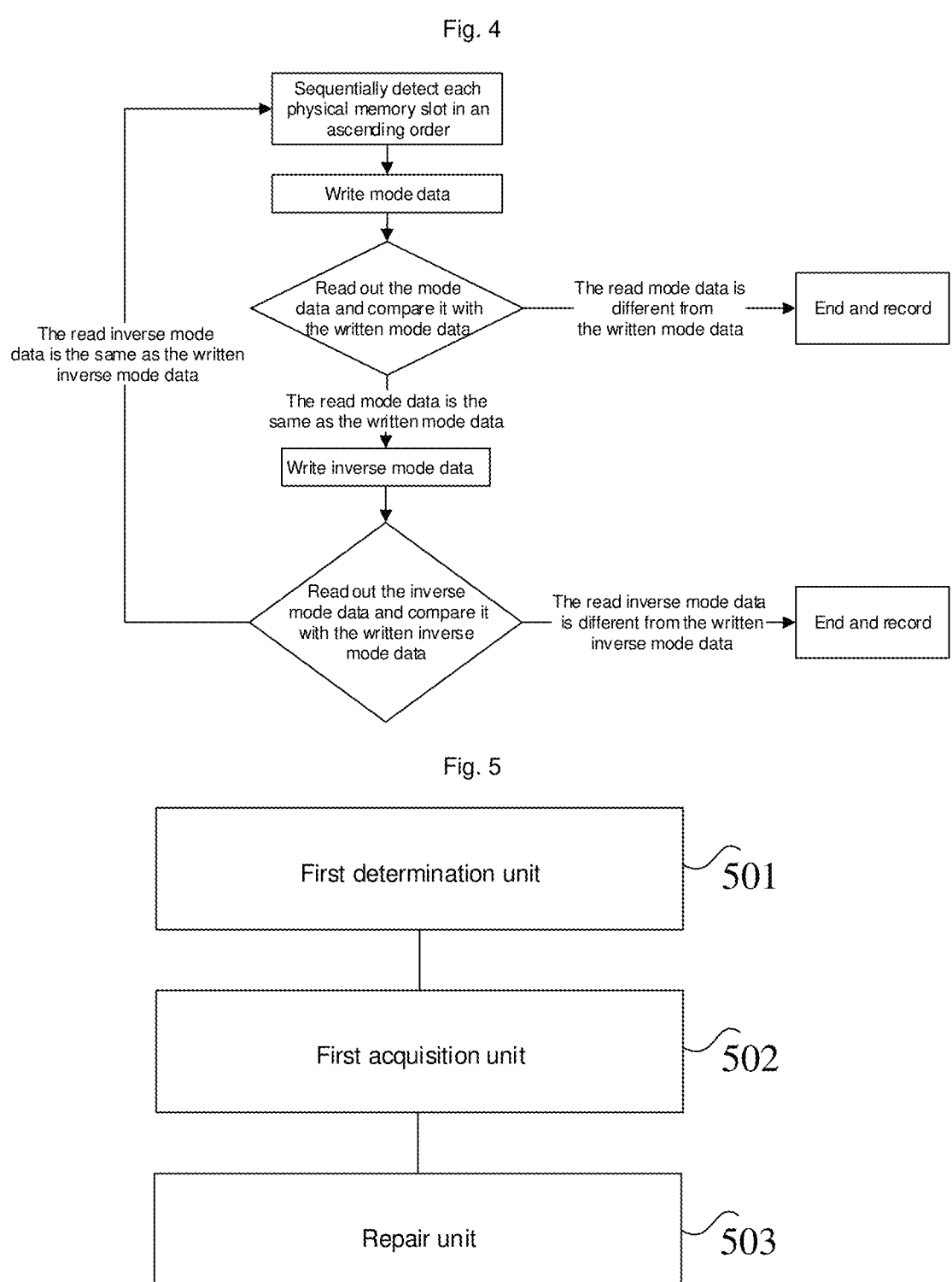
FIG. 4 is a flowchart of memory detect provided according to Embodiment I of the present disclosure.
FIG. 5 is a schematic diagram of an apparatus processing method based on a server provided according to Embodiment II of the present disclosure.

In some optional embodiments, the memory detect process is as shown in FIG. 4, in which mode data (i.e. the described first data) is written, the written data is read from a memory; and if the two are consistent, inverse mode data (i.e. the described second data) is written. If the two are different, the memory is a faulty memory. After the inverse mode data is written, the written data is read from the memory again; and it is judged whether the two are the same, and if not, the memory is a faulty memory. The faulty memory and a fault bit in the faulty memory are recorded.

In the embodiments of the present disclosure, according to a target flag bit stored in a baseboard management controller, whether to perform a detecting and repairing operation on memories of a target server is determined; in a case where it is determined to perform a detecting and repairing operation on the memories of the target server, memory hardware parameters of a plurality of memories in the target server are acquired, and a detection strategy for each memory is determined according to the memory hardware parameters; and each memory is detected according to the detection strategy for each memory to determine a faulty memory, and the faulty memory is repaired, thereby solving the technical problem in the related art that when a memory of a server fails, the faulty memory is directly replaced, resulting in a low utilization rate of the memory. In the present solution, when it is determined that it is necessary to perform a detecting and repairing operation on memories, a detection strategy for each memory is determined by memory hardware parameters; accurate detect of the memory is realized by different detection strategies; and after a faulty memory is determined, a fault module is repaired, thereby achieving the effect of increasing the utilization rate of the memory.

It should be noted that for brevity of description, the method embodiments above are described as a series of action combinations. However, a person skilled in the art should understand that the present disclosure is not limited to the described sequence of actions, because according to the present disclosure, some steps may be performed in other sequences or performed simultaneously. Secondly, a person skilled in the art should also be aware that the embodiments described in the description are all optional embodiments, and the involved actions and modules are not necessarily required in the present disclosure.

From the description of the described embodiments, a person skilled in the art would have been able to clearly understand that the method in the described embodiments may be implemented by using software and necessary general hardware platforms, and of course may also be implemented using hardware, but in many cases, the former is a better embodiment. On the basis of such understanding, the portion of the technical solution of the present disclosure that contributes in essence or to the related art may be embodied in the form of a software product stored in a non-transitory readable storage medium (such as an ROM/ RAM, a magnetic disk and an optical disc); and the storage medium comprises several instructions to cause a terminal device (which may be a mobile phone, a computer, a server or a network device, etc.) to perform the method according to the various embodiments of the present disclosure.

According to embodiments of the present disclosure, an apparatus processing method based on a server for implementing the described memory processing method based on a server is further provided. As shown in FIG. 5, the apparatus comprises: a first determination unit 501, a first acquisition unit 502 and a repair unit 503.

The first determination unit 501 is configured to determine, according to a target flag bit stored in a baseboard management controller, whether to perform a detecting and repairing operation on memories of a target server;

the first acquisition unit 502 is configured to acquire memory hardware parameters of each memory among a plurality of memories of the target server in a case where it is determined to perform a detecting and repairing operation on the memories of the target server, and determine a detection strategy for each memory according to the memory hardware parameters of each memory; and the repair unit 503 is configured to detect each memory among a plurality of memories of the target server according to the detection strategy for each memory to determine a faulty memory from the plurality of memories of the target server, and configured to repair the faulty memory.

In the apparatus processing method based on a server provided in embodiments of the present disclosure, the first determination unit 501 determines, according to a target flag bit stored in a baseboard management controller, whether to perform a detecting and repairing operation on memories of a target server; the first acquisition unit 502 acquires memory hardware parameters of a plurality of memories in the target server in a case where it is determined to perform a detecting and repairing operation on the memories of the target server, and determines a detection strategy for each memory according to the memory hardware parameters; and the repair unit 503 detects each memory according to the detection strategy for each memory to determine a faulty memory, and repairs the faulty memory, thereby solving the technical problem in the related art that when a memory of a server fails, the faulty memory is directly replaced, resulting in a low utilization rate of the memory. In the present solution, when it is determined that it is necessary to perform a detecting and repairing operation on memories, a detection strategy for each memory is determined by memory hardware parameters; accurate detect of the memory is realized by different detection strategies; and after a faulty memory is determined, a fault module is repaired, thereby achieving the effect of increasing the utilization rate of the memory.

Optionally, in the apparatus processing method based on a server provided in Embodiment II of the present disclosure, the repair unit 503 comprises: a detect sub-unit, configured to the each memory of the plurality of memories according to the detection strategy for the each memory to determine the faulty memory from the plurality of memories and a fault bit corresponding to the faulty memory, wherein the fault bit is the smallest storage unit in the faulty memory; and a replacement sub-unit, configured to the fault bit corresponding to the faulty memory with a redundant bit in the faulty memory to repair the faulty memory.

Optionally, in the apparatus processing method based on a server provided in Embodiment II of the present disclosure, the apparatus further comprises: a detection unit, configured to detect, while the target server is running, whether a memory in the target server reports an error before the determining, according to a target flag bit stored in a baseboard management controller, whether to perform a detecting and repairing operation on a plurality of memories of a target server; a triggering unit, configured to trigger a system management interruption to send data information of the error reported by the memory to the baseboard management controller in a case where a memory in the target server reports an error, to configure the target flag bit to be a first preset value by the baseboard management controller; and a restart unit, configured to restart the target server.

Optionally, in the apparatus processing method based on a server provided in Embodiment II of the present disclosure, the first determination unit comprises: a reading sub-unit, configured to enable the target server to read the target flag bit from the baseboard management controller; and an execution sub-unit, configured to perform the detecting and repairing operation on the plurality of memories of the target server in a case where the target flag bit is the first preset value.

Optionally, in the apparatus processing method based on a server provided in Embodiment II of the present disclosure, the first acquisition unit comprises: a first reading sub-unit, configured to read, according to the memory hardware parameter of the each memory, historical data information of the each memory stored in the baseboard management controller, wherein the historical data information at least comprises: a runtime duration, a number of repair and a number of repaired bits; and a first determination sub-unit, configured to determine the detection strategy for the each memory according to the historical data information of the each memory.

Optionally, in the apparatus processing method based on a server provided in Embodiment II of the present disclosure, the first determination unit further comprises: a second reading sub-unit, configured to read, according to the memory hardware parameter of the each memory, a preset detection strategy stored in the baseboard management controller, wherein the preset detection strategy is a detection strategy configured based on an intelligent platform management interface instruction; and a second determination sub-unit, configured to determine the preset detection strategy as the detection strategy for the each memory.

Optionally, in the apparatus processing method based on a server provided in Embodiment II of the present disclosure, the detection strategy is one of: a first detection strategy, a second detection strategy, and a third detection strategy, wherein a detecting speed of the first detection strategy is lower than a detecting speed of the second detection strategy, and the third detection strategy is a pre-configured detection strategy.

Optionally, in the apparatus processing method based on a server provided in Embodiment II of the present disclosure, the detect sub-unit comprises: a first detect module, configured to perform a fault detection on each storage chip of the each memory to determine the faulty memory from the plurality of memories and the fault bit corresponding to the faulty memory in a case where the detection strategy is the first detection strategy.

Optionally, in the apparatus processing method based on a server provided in Embodiment II of the present disclosure, the detect sub-unit comprises: a second detect module, configured to perform a sampling detection on storage chips of the each memory to determine the faulty memory from the plurality of memories and the fault bit corresponding to the faulty memory in a case where the detection strategy is the second detection strategy.

Optionally, in the apparatus processing method based on a server provided in Embodiment II of the present disclosure, the detect sub-unit comprises: a first determination module, configured to determine, in a case where the detection strategy is the third detection strategy, a detection character corresponding to the third detection strategy and a response time corresponding to the third detection strategy, wherein the detection character is configured to be written into the each memory to determine whether each memory has a fault, and the preset response time is the time for writing a character to the each memory; and a third detect module, configured to detect the each memory according to the detection character and the response time to determine the faulty memory from the plurality of memories and the fault bit corresponding to the faulty memory.

Optionally, in the apparatus processing method based on a server provided in Embodiment II of the present disclosure, the detect sub-unit comprises: a second determination module, configured to determine first data and second data, wherein the first data and the second data are configured to be written into the each memory, the second data is obtained by performing a bitwise inversion on the first data; and a third determination module, configured to determine the faulty memory from the plurality of memories and the fault bit corresponding to the faulty memory according to the first data and the second data.

Optionally, in the apparatus processing method based on a server provided in Embodiment II of the present disclosure, the second determination module comprises: a first writing sub-module, configured to write the first data into the each memory, and read the first data from the each memory after a first preset time to obtain first read data; a first determination sub-module, configured to determine, in a case where the first read data corresponding to a first memory from the plurality of memories is different from the first data, the first memory as the faulty memory, and determining the fault bit corresponding to the faulty memory according to the first read data; a second writing sub-module, configured to the second data into the each memory in a case where the first data is the same as the first read data, and reading the second data from the each memory after a second preset time to obtain second read data; and a second determination sub-module, configured to determine, in a case where the second read data corresponding to a second memory from the plurality of memories is different from the second data, the second memory as the faulty memory, and determining the fault bit corresponding to the faulty memory according to the second read data.

Optionally, in the apparatus processing method based on a server provided in Embodiment II of the present disclosure, the replacement sub-unit comprises: a first judgment module, configured to judge whether the redundant bit exists in the faulty memory; and a first replacement module, configured to replace, in a case where the redundant bit exists in the faulty memory, the fault bit corresponding to the faulty memory with the redundant bit in the faulty memory to repair the faulty memory.

Optionally, in the apparatus processing method based on a server provided in Embodiment II of the present disclosure, the apparatus further comprises: a second determination unit, configured to indicate, after judging whether the redundant bit exists in the faulty memory, that the faulty memory is irreparable in a case where no redundant bit exists in the faulty memory.

Optionally, in the apparatus processing method based on a server provided in Embodiment II of the present disclosure, the replacement sub-unit comprises: a fourth determination unit, configured to determine whether a memory repair criterion corresponding to the faulty memory exists according to the memory hardware parameter of the faulty memory, wherein the memory repair criterion at least comprises: a number of repair being less than a second preset value and/or a number of repaired bits being less than a third preset value; a second judgment module, configured to judge, in a case where the memory repair criterion corresponding to the faulty memory exists, whether the number of repair and the number of repaired bits corresponding to the faulty memory meet the memory repair criterion; and a second replacement module, configured to replace, in a case where the number of repair and the number of repaired bits corresponding to the faulty memory meet the memory repair criterion, the fault bit corresponding to the faulty memory with the redundant bit in the faulty memory to repair the faulty memory.

Optionally, in the apparatus processing method based on a server provided in Embodiment II of the present disclosure, the apparatus further comprises: a third determination unit, configured to indicate, after judging whether the faulty memory meets the memory repair criterion, that the faulty memory is irreparable in a case where the number of repair and the number of repaired bits corresponding to the faulty memory does not meet the memory repair criterion.

Optionally, in the apparatus processing method based on a server provided in Embodiment II of the present disclosure, the apparatus further comprises: a fourth determination unit, configured to determine a faulty memory which is irreparable, a faulty memory which is repaired, and a non-faulty memory in the plurality of memories after replacing the fault bit corresponding to the faulty memory with the redundant bit in the faulty memory to repair the faulty memory; a second acquisition unit, configured to acquire first data information of the faulty memory which is irreparable, acquire second data information of the faulty memory which is repaired, and acquire third data information of the non-faulty memory; and a fifth determination unit, configured to determine memory detecting and repairing results of the target server according to the first data information, the second data information, and the third data information.

Optionally, in the apparatus processing method based on a server provided in Embodiment II of the present disclosure, the apparatus further comprises: a first sending unit, configured to send the memory detecting and repairing result to the baseboard management controller after determining the memory detecting and repairing results of the target server according to the first data information, the second data information, and the third data information; an identification unit, configured to the memory detecting and repairing result by the baseboard management controller, and identify the faulty memory which is irreparable;

and a second sending unit, configured to send the faulty memory which is irreparable to a target object to perform replacement processing on the faulty memory which is irreparable by the target object.

Optionally, in the apparatus processing method based on a server provided in Embodiment II of the present disclosure, the apparatus further comprises: a storage unit, configured to store, after sending the faulty memory which is irreparable to the target object, each of the memory detecting and repairing results into historical data information corresponding to corresponding one memory of the plurality of memories according to the memory hardware parameter of the corresponding one memory.

Optionally, in the apparatus processing method based on a server provided in Embodiment II of the present disclosure, the apparatus further comprises: an evaluation unit, configured to determine, after storing each of the memory detecting and repairing results into historical data information corresponding to corresponding one memory of the plurality of memories, a health status of each memory according to the historical data information corresponding to the each memory to obtain a determination result; and an update unit, configured to update a preset detection strategy for the plurality of memories according to the determination result.

It should be noted here that, the first determination unit 501, the first acquisition unit 502, and the repair unit 503 correspond to step S201 to step S203 in Embodiment 1, and examples and application scenarios implemented by the three units are the same as those implemented by the corresponding steps, but are not limited to the content disclosed in Embodiment I. It should be noted that the modules, as a part of the apparatus, may run in the computer terminal 10 provided in Embodiment I.

It should be noted that, the optional embodiments involved in the embodiments of the present disclosure are the same as the solutions, application scenarios, and implementation processes provided in Embodiment 1, but are not limited to the solution provided in Embodiment 1.

Embodiments of the present disclosure can provide a computer terminal; the computer terminal can be any one computer terminal device in a computer terminal group. Optionally, in the present embodiment, the computer terminal may also be replaced with a terminal device such as a mobile terminal.

Optionally, in the present embodiment, the computer terminal may be located in at least one network device among a plurality of network devices in a computer network.

In the present embodiment, the computer terminal may execute program codes of the following steps in the memory processing method based on a server: determining, according to a target flag bit stored in a baseboard management controller, whether to perform a detecting and repairing operation on a plurality of memories of a target server; in a case where it is determined to perform the detecting and repairing operation on the plurality of memories of the target server, acquiring a memory hardware parameter of each memory of the plurality of memories of the target server, and determining a detection strategy for the each memory according to the memory hardware parameter of the each memory; and detecting the each memory of the plurality of memories according to the detection strategy for the each memory to determine a faulty memory from the plurality of memories, and repairing the faulty memory.

The computer terminal may execute program codes of the following steps in the memory processing method based on a server: the detecting the each memory of the plurality of memories according to the detection strategy for the each memory to determine a faulty memory from the plurality of memories, and repairing the faulty memory, comprise: detecting the each memory of the plurality of memories according to the detection strategy for the each memory to determine the faulty memory from the plurality of memories and a fault bit corresponding to the faulty memory, wherein the fault bit is the smallest storage unit in the faulty memory; and replacing the fault bit corresponding to the faulty memory with a redundant bit in the faulty memory to repair the faulty memory.

The computer terminal may execute program codes of the following steps in the memory processing method based on a server: before the determining, according to a target flag bit stored in a baseboard management controller, whether to perform a detecting and repairing operation on a plurality of memories of a target server, the method further comprises: detecting, while the target server is running, whether a memory in the target server reports an error; in a case where a memory in the target server reports an error, triggering a system management interruption to send data information of the error reported by the memory to the baseboard management controller to configure the target flag bit to be a first preset value by the baseboard management controller; and restarting the target server.

The computer terminal may execute program codes of the following steps in the memory processing method based on a server: the determining, according to a target flag bit stored in a baseboard management controller, whether to perform a detecting and repairing operation on a plurality of memories of a target server, comprises: reading, by the target server, the target flag bit from the baseboard management controller; and in a case where the target flag bit is the first preset value, determining to perform the detecting and repairing operation on the plurality of memories of the target server.

The computer terminal may execute program codes of the following steps in the memory processing method based on a server: the determining a detection strategy for the each memory according to the memory hardware parameter of the each memory, comprises: reading, according to the memory hardware parameter of the each memory, historical data information of the each memory stored in the baseboard management controller, wherein the historical data information at least comprises: a runtime duration, a number of repair and a number of repaired bits; and determining the detection strategy for the each memory according to the historical data information of the each memory.

The computer terminal may execute program codes of the following steps in the memory processing method based on a server: the determining a detection strategy for the each memory according to the memory hardware parameter of the each memory, comprises: reading, according to the memory hardware parameter of the each memory, a preset detection strategy stored in the baseboard management controller, wherein the preset detection strategy is a detection strategy configured based on an intelligent platform management interface instruction; and determining the preset detection strategy as the detection strategy for the each memory.

The computer terminal may execute program codes of the following steps in the memory processing method based on a server: the detection strategy is one of the following: a first detection strategy, a second detection strategy, and a third detection strategy, wherein a detecting speed of the first detection strategy is lower than a detecting speed of the second detection strategy, and the third detection strategy is a pre-configured detection strategy.

The computer terminal may execute program codes of the following steps in the memory processing method based on a server: the detecting the each memory of the plurality of memories according to the detection strategy for the each memory to determine the faulty memory from the plurality of memories and a fault bit corresponding to the faulty memory, comprises: in a case where the detection strategy is the first detection strategy, performing a fault detection on each storage chip of the each memory to determine the faulty memory from the plurality of memories and the fault bit corresponding to the faulty memory.

The computer terminal may execute program codes of the following steps in the memory processing method based on a server: the detecting the each memory of the plurality of memories according to the detection strategy for the each memory to determine the faulty memory from the plurality of memories and a fault bit corresponding to the faulty memory, comprises: in a case where the detection strategy is the second detection strategy, performing a sampling detection on storage chips of the each memory to determine the faulty memory from the plurality of memories and the fault bit corresponding to the faulty memory.

The computer terminal may execute program codes of the following steps in the memory processing method based on a server: the detecting the each memory of the plurality of memories according to the detection strategy for the each memory to determine the faulty memory from the plurality of memories and a fault bit corresponding to the faulty memory, comprises: in a case where the detection strategy is the third detection strategy, determining a detection character corresponding to the third detection strategy and a response time corresponding to the third detection strategy, wherein the detection character is configured to be written into the each memory to determine whether each memory has a fault, and the preset response time is the time for writing a character to the each memory; and detecting the each memory according to the detection character and the response time to determine the faulty memory from the plurality of memories and the fault bit corresponding to the faulty memory.

The computer terminal may execute program codes of the following steps in the memory processing method based on a server: the detecting the each memory of the plurality of memories according to the detection strategy for the each memory to determine a faulty memory from the plurality of memories and a fault bit corresponding to the faulty memory, comprises: determining first data and second data, wherein the first data and the second data are configured to be written into the each memory, the second data is obtained by performing a bitwise inversion on the first data; and determining the faulty memory from the plurality of memories and the fault bit corresponding to the faulty memory according to the first data and the second data.

The computer terminal may execute program codes of the following steps in the memory processing method based on a server: determining the faulty memory from the plurality of memories and the fault bit corresponding to the faulty memory according to the first data and the second data, comprises: writing the first data into the each memory, and reading the first data from the each memory after a first preset time to obtain first read data; in a case where the first read data corresponding to a first memory from the plurality of memories is different from the first data, determining the first memory as the faulty memory, and determining the fault bit corresponding to the faulty memory according to the first read data; in a case where the first data is the same as the first read data, writing the second data into the each memory, and reading the second data from the each memory after a second preset time to obtain second read data; and in a case where the second read data corresponding to a second memory from the plurality of memories is different from the second data, determining the second memory as the faulty memory, and determining the fault bit corresponding to the faulty memory according to the second read data.

The computer terminal may execute program codes of the following steps in the memory processing method based on a server: replacing the fault bit corresponding to the faulty memory with a redundant bit in the faulty memory to repair the faulty memory, comprises: judging whether the redundant bit exists in the faulty memory; and in a case where the redundant bit exists in the faulty memory, replacing the fault bit corresponding to the faulty memory with the redundant bit in the faulty memory to repair the faulty memory.

The computer terminal may execute program codes of the following steps in the memory processing method based on a server: after judging whether the redundant bit exists in the faulty memory, the method further comprises: in a case where no redundant bit exists in the faulty memory, indicating that the faulty memory is irreparable.

The computer terminal may execute program codes of the following steps in the memory processing method based on a server: the in a case where the redundant bit exists in the faulty memory, replacing the fault bit corresponding to the faulty memory with the redundant bit in the faulty memory to repair the faulty memory, comprises: determining whether a memory repair criterion corresponding to the faulty memory exists according to the memory hardware parameter of the faulty memory, wherein the memory repair criterion at least comprises: a number of repair being less than a second preset value and/or a number of repaired bits being less than a third preset value; in a case where the memory repair criterion corresponding to the faulty memory exists, judging whether the number of repair and the number of repaired bits corresponding to the faulty memory meet the memory repair criterion; and in a case where the number of repair and the number of repaired bits corresponding to the faulty memory meet the memory repair criterion, replacing the fault bit corresponding to the faulty memory with the redundant bit in the faulty memory to repair the faulty memory.

The computer terminal may execute program codes of the following steps in the memory processing method based on a server: after judging whether the faulty memory meets the memory repair criterion, the method further comprises: in a case where the number of repair and the number of repaired bits corresponding to the faulty memory does not meet the memory repair criterion, indicating that the faulty memory is irreparable.

The computer terminal may execute program codes of the following steps in the memory processing method based on a server: after replacing the fault bit corresponding to the faulty memory with the redundant bit in the faulty memory to repair the faulty memory, the method further comprises: determining a faulty memory which is irreparable, a faulty memory which is repaired, and a non-faulty memory in the plurality of memories; acquiring first data information of the faulty memory which is irreparable, acquiring second data information of the faulty memory which is repaired, and acquiring third data information of the non-faulty memory; and determining memory detecting and repairing results of the target server according to the first data information, the second data information, and the third data information.

The computer terminal may execute program codes of the following steps in the memory processing method based on a server: after determining the memory detecting and repairing results of the target server according to the first data information, the second data information, and the third data information, the method further comprises: sending the memory detecting and repairing result to the baseboard management controller; reading the memory detecting and repairing result by the baseboard management controller, and identifying the faulty memory which is irreparable; and sending the faulty memory which is irreparable to a target object to perform replacement processing on the faulty memory which is irreparable by the target object.

The computer terminal may execute program codes of the following steps in the memory processing method based on a server: after sending the faulty memory which is irreparable to the target object, the method further comprises: storing each of the memory detecting and repairing results into historical data information corresponding to corresponding one memory of the plurality of memories according to the memory hardware parameter of the corresponding one memory.

The computer terminal may execute program codes of the following steps in the memory processing method based on a server: after storing each of the memory detecting and repairing results into historical data information corresponding to corresponding one memory of the plurality of memories, the method further comprises: determining a health status of each memory according to the historical data information corresponding to the each memory to obtain a determination result; and updating a preset detection strategy for the plurality of memories according to the determination result.

Figure 6:
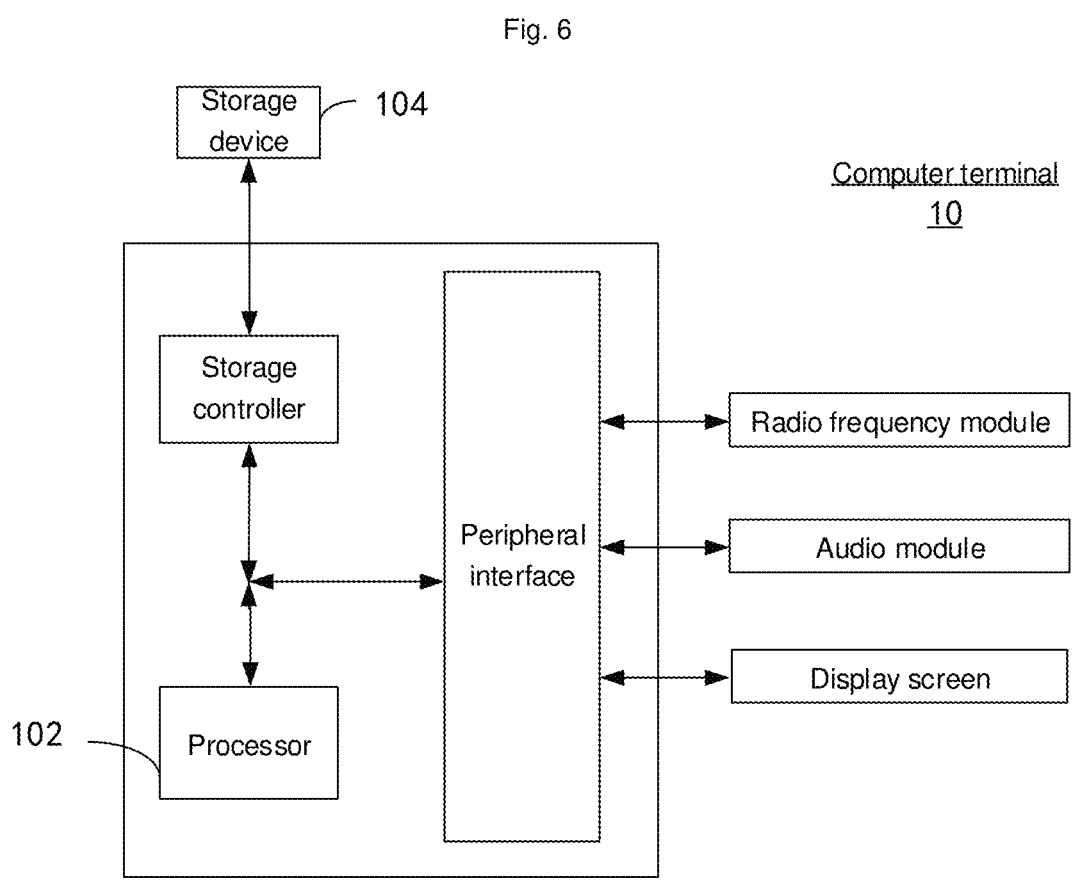

Optionally, FIG. 6 is a structural block diagram of a computer terminal according to embodiments of the present disclosure. As shown in FIG. 6, the computer terminal 10 may comprise one or more (only one is shown in FIG. 6) processors and a storage device.

The storage device may be configured to store software programs and modules, such as program instructions/modules corresponding to the memory processing method based on a server and apparatus in the embodiments of the present disclosure; and the processor runs the software programs and modules stored in the storage device, so as to execute various functional applications and data processing, i.e. implementing the described memory processing method based on a server. The storage device may include a high-speed random access memory, and may also include a non-transitory memory, such as one or more magnetic storage apparatuses, flash memories or other non-transitory solid-state memories. In some examples, the storage device may further include storage devices remotely arranged with respect to the processors, and these remote storage devices may be connected to the computer terminal 10 via a network. Examples of the network include, but are not limited to the Internet, an intranet, a local area network, a mobile communication network and combinations thereof.

The processor can call information and an application program stored in the storage device via the transmission apparatus to execute the following steps: determining, according to a target flag bit stored in a baseboard management controller, whether to perform a detecting and repairing operation on a plurality of memories of a target server; in a case where it is determined to perform the detecting and repairing operation on the plurality of memories of the target server, acquiring a memory hardware parameter of each memory of the plurality of memories of the target server, and determining a detection strategy for the each memory according to the memory hardware parameter of the each memory; and detecting the each memory of the plurality of memories according to the detection strategy for the each memory to determine a faulty memory from the plurality of memories, and repairing the faulty memory.

Optionally, the processor can further execute program codes of the following steps: the detecting the each memory of the plurality of memories according to the detection strategy for the each memory to determine a faulty memory from the plurality of memories, and repairing the faulty memory, comprise: detecting the each memory of the plurality of memories according to the detection strategy for the each memory to determine the faulty memory from the plurality of memories and a fault bit corresponding to the faulty memory, wherein the fault bit is the smallest storage unit in the faulty memory; and replacing the fault bit corresponding to the faulty memory with a redundant bit in the faulty memory to repair the faulty memory.

Optionally, the processor can further execute program codes of the following steps: before the determining, according to a target flag bit stored in a baseboard management controller, whether to perform a detecting and repairing operation on a plurality of memories of a target server, the method further comprises: detecting, while the target server is running, whether a memory in the target server reports an error; in a case where a memory in the target server reports an error, triggering a system management interruption to send data information of the error reported by the memory to the baseboard management controller to configure the target flag bit to be a first preset value by the baseboard management controller; and restarting the target server.

Optionally, the processor can further execute program codes of the following steps: the determining, according to a target flag bit stored in a baseboard management controller, whether to perform a detecting and repairing operation on a plurality of memories of a target server, comprises: reading, by the target server, the target flag bit from the baseboard management controller; and in a case where the target flag bit is the first preset value, determining to perform the detecting and repairing operation on the plurality of memories of the target server.

Optionally, the processor can further execute program codes of the following steps: the determining a detection strategy for the each memory according to the memory hardware parameter of the each memory, comprises: reading, according to the memory hardware parameter of the each memory, historical data information of the each memory stored in the baseboard management controller, wherein the historical data information at least comprises: a runtime duration, a number of repair and a number of repaired bits; and determining the detection strategy for the each memory according to the historical data information of the each memory.

Optionally, the processor can further execute program codes of the following steps: the determining a detection strategy for the each memory according to the memory hardware parameter of the each memory, comprises: reading, according to the memory hardware parameter of the each memory, a preset detection strategy stored in the baseboard management controller, wherein the preset detection strategy is a detection strategy configured based on an intelligent platform management interface instruction; and determining the preset detection strategy as the detection strategy for the each memory.

Optionally, the processor can further execute program codes of the following steps: the detection strategy is one of the following: a first detection strategy, a second detection strategy, and a third detection strategy, wherein a detecting speed of the first detection strategy is lower than a detecting speed of the second detection strategy, and the third detection strategy is a pre-configured detection strategy.

Optionally, the processor can further execute program codes of the following steps: the detecting the each memory of the plurality of memories according to the detection strategy for the each memory to determine the faulty memory from the plurality of memories and a fault bit corresponding to the faulty memory, comprises: in a case where the detection strategy is the first detection strategy, performing a fault detection on each storage chip of the each memory to determine the faulty memory from the plurality of memories and the fault bit corresponding to the faulty memory.

Optionally, the processor can further execute program codes of the following steps: the detecting the each memory of the plurality of memories according to the detection strategy for the each memory to determine the faulty memory from the plurality of memories and a fault bit corresponding to the faulty memory, comprises: in a case where the detection strategy is the second detection strategy, performing a sampling detection on storage chips of the each memory to determine the faulty memory from the plurality of memories and the fault bit corresponding to the faulty memory.

Optionally, the processor can further execute program codes of the following steps: the detecting the each memory of the plurality of memories according to the detection strategy for the each memory to determine the faulty memory from the plurality of memories and a fault bit corresponding to the faulty memory, comprises: in a case where the detection strategy is the third detection strategy, determining a detection character corresponding to the third detection strategy and a response time corresponding to the third detection strategy, wherein the detection character is configured to be written into the each memory to determine whether each memory has a fault, and the preset response time is the time for writing a character to the each memory; and detecting the each memory according to the detection character and the response time to determine the faulty memory from the plurality of memories and the fault bit corresponding to the faulty memory.

Optionally, the processor can further execute program codes of the following steps: the detecting the each memory of the plurality of memories according to the detection strategy for the each memory to determine a faulty memory from the plurality of memories and a fault bit corresponding to the faulty memory, comprises: determining first data and second data, wherein the first data and the second data are configured to be written into the each memory, the second data is obtained by performing a bitwise inversion on the first data; and determining the faulty memory from the plurality of memories and the fault bit corresponding to the faulty memory according to the first data and the second data.

Optionally, the processor can further execute program codes of the following steps: determining the faulty memory from the plurality of memories and the fault bit corresponding to the faulty memory according to the first data and the second data, comprises: writing the first data into the each memory, and reading the first data from the each memory after a first preset time to obtain first read data; in a case where the first read data corresponding to a first memory from the plurality of memories is different from the first data, determining the first memory as the faulty memory, and determining the fault bit corresponding to the faulty memory according to the first read data; in a case where the first data is the same as the first read data, writing the second data into the each memory, and reading the second data from the each memory after a second preset time to obtain second read data; and in a case where the second read data corresponding to a second memory from the plurality of memories is different from the second data, determining the second memory as the faulty memory, and determining the fault bit corresponding to the faulty memory according to the second read data.

Optionally, the processor can further execute program codes of the following steps: replacing the fault bit corresponding to the faulty memory with a redundant bit in the faulty memory to repair the faulty memory, comprises: judging whether the redundant bit exists in the faulty memory; and in a case where the redundant bit exists in the faulty memory, replacing the fault bit corresponding to the faulty memory with the redundant bit in the faulty memory to repair the faulty memory.

Optionally, the processor can further execute program codes of the following steps: after judging whether the redundant bit exists in the faulty memory, the method further comprises: in a case where no redundant bit exists in the faulty memory, indicating that the faulty memory is irreparable.

Optionally, the processor can further execute program codes of the following steps: the in a case where the redundant bit exists in the faulty memory, replacing the fault bit corresponding to the faulty memory with the redundant bit in the faulty memory to repair the faulty memory, comprises: determining whether a memory repair criterion corresponding to the faulty memory exists according to the memory hardware parameter of the faulty memory, wherein the memory repair criterion at least comprises: a number of repair being less than a second preset value and/or a number of repaired bits being less than a third preset value; in a case where the memory repair criterion corresponding to the faulty memory exists, judging whether the number of repair and the number of repaired bits corresponding to the faulty memory meet the memory repair criterion; and in a case where the number of repair and the number of repaired bits corresponding to the faulty memory meet the memory repair criterion, replacing the fault bit corresponding to the faulty memory with the redundant bit in the faulty memory to repair the faulty memory.

Optionally, the processor can further execute program codes of the following steps: after judging whether the faulty memory meets the memory repair criterion, the method further comprises: in a case where the number of repair and the number of repaired bits corresponding to the faulty memory does not meet the memory repair criterion, indicating that the faulty memory is irreparable.

Optionally, the processor can further execute program codes of the following steps: after replacing the fault bit corresponding to the faulty memory with the redundant bit in the faulty memory to repair the faulty memory, the method further comprises: determining a faulty memory which is irreparable, a faulty memory which is repaired, and a non-faulty memory in the plurality of memories; acquiring first data information of the faulty memory which is irreparable, acquiring second data information of the faulty memory which is repaired, and acquiring third data information of the non-faulty memory; and determining memory detecting and repairing results of the target server according to the first data information, the second data information, and the third data information.

Optionally, the processor can further execute program codes of the following steps: after determining the memory detecting and repairing results of the target server according to the first data information, the second data information, and the third data information, the method further comprises: sending the memory detecting and repairing result to the baseboard management controller; reading the memory detecting and repairing result by the baseboard management controller, and identifying the faulty memory which is irreparable; and sending the faulty memory which is irreparable to a target object to perform replacement processing on the faulty memory which is irreparable by the target object.

Optionally, the processor can further execute program codes of the following steps: after sending the faulty memory which is irreparable to the target object, the method further comprises: storing each of the memory detecting and repairing results into historical data information corresponding to corresponding one memory of the plurality of memories according to the memory hardware parameter of the corresponding one memory.

Optionally, the processor can further execute program codes of the following steps: after storing each of the memory detecting and repairing results into historical data information corresponding to corresponding one memory of the plurality of memories, the method further comprises: determining a health status of each memory according to the historical data information corresponding to the each memory to obtain a determination result; and updating a preset detection strategy for the plurality of memories according to the determination result.

A person of ordinary skill in the art may understand that, the structure shown in FIG. 6 is only a schematic diagram, and the computer terminal may also be a terminal device such as a smart phone (for example, an Android mobile phone and an iOS mobile phone), a tablet computer, a palmtop computer, mobile Internet devices (MIDs), and a PAD. FIG. 6 does not limit the structure of the electronic apparatus above. For example, the computer terminal 10 may also comprise more or fewer assemblies (a network interface, a display apparatus, etc.) than those shown in FIG. 6, or have different configurations from that shown in FIG. 6.

A person of ordinary skill in the art should understand that all or part of the steps of the method in the embodiments may be implemented by a program instructing relevant hardware of the terminal device. The program may be stored in a non-transitory readable storage medium, and the non-transitory readable storage medium may comprise a flash disk, a read-only memory (ROM), a random access memory (RAM), a magnetic disk, or an optical disk.

The serial numbers of the embodiments in the present disclosure are only for illustration, and do not represent the preference of the embodiments.

In the embodiments of the present disclosure, the illustration of each embodiment has its own emphasis. For the part not detailed in a certain embodiment, please refer to the relevant illustration in other embodiments.

In the several embodiments provided in the present disclosure, it should be understood that the disclosed technical content may be implemented in other manners. The apparatus embodiment described above is only schematic. For example, the division of the units can be logical functional division, and there can be other division methods in the actual implementation, for example, multiple units or assemblies can be combined or integrated into another system, or some features can be ignored or not executed. In addition, the mutual coupling or direct coupling or communication connection shown or discussed may be indirect coupling or communication connection via some interfaces, units or modules, and may be in the form of electricity or other forms.

The units described as separate components may or may not be physically separated, and the components displayed as units may or may not be physical units, that is, may be located in one place, or may be distributed to multiple network units. Some or all units can be selected as actually needed to achieve the purpose of the solutions of the embodiments.

In addition, functional units in the embodiments of the present disclosure may be integrated into one processing unit, or the units may exist physically alone, or two or more units are integrated into one unit. The integrated unit may be implemented in the form of hardware, and may also be implemented in the form of a software functional unit.

If the integrated unit is implemented in the form of a software functional unit and is sold or used as an independent product, the integrated unit can be stored in a non-transitory readable storage medium. On the basis of such understanding, the portion of the technical solution of the present disclosure that contributes in essence or to the related art or all or part of the technical solution may be embodied in the form of a software product, the computer software product being stored in a non-transitory readable storage medium. Several instructions are included to cause a computer device (which may be a personal computer, server or network device, etc.) to perform all or part of the steps of the method in various embodiments of the present disclosure. Moreover, the non-transitory readable storage medium above includes: media such as a USB flash disk, a read-only memory (ROM), a random access memory (RAM), a mobile hard disk, a magnetic disk, or an optical disk, and the like which can store program codes.

The content above only relates to optional embodiments of the present disclosure. It should be noted that for a person of ordinary skill in the art, several improvements and modifications can also be made without departing from the principle of the present disclosure, and these improvements and modifications shall also be considered as within the scope of protection of the present disclosure.

The invention claimed is:

1. A memory processing method based on a server, comprising:
    determining, according to a target flag bit stored in a baseboard management controller, whether to perform a detecting and repairing operation on a plurality of memories of a target server;
    in a case where it is determined to perform the detecting and repairing operation on the plurality of memories of the target server, acquiring a memory hardware parameter of each memory of the plurality of memories of the target server, and determining a detection strategy for the each memory according to the memory hardware parameter of the each memory; and
    detecting the each memory of the plurality of memories according to the detection strategy for the each memory to determine a faulty memory from the plurality of memories, and repairing the faulty memory.

2. The method according to claim 1, wherein the detecting the each memory of the plurality of memories according to the detection strategy for the each memory to determine a faulty memory from the plurality of memories, and repairing the faulty memory, comprise:
    detecting the each memory of the plurality of memories according to the detection strategy for the each memory to determine the faulty memory from the plurality of memories and a fault bit corresponding to the faulty memory, wherein the fault bit is the smallest storage unit in the faulty memory; and
    replacing the fault bit corresponding to the faulty memory with a redundant bit in the faulty memory to repair the faulty memory.

3. The method according to claim 2, wherein the detection strategy is one of the following: a first detection strategy, a second detection strategy, and a third detection strategy, wherein a detecting speed of the first detection strategy is lower than a detecting speed of the second detection strategy, and the third detection strategy is a pre-configured detection strategy.

4. The method according to claim 3, wherein the detecting the each memory of the plurality of memories according to the detection strategy for the each memory to determine the faulty memory from the plurality of memories and a fault bit corresponding to the faulty memory, comprises:
    in a case where the detection strategy is the first detection strategy, performing a fault detection on each storage chip of the each memory to determine the faulty memory from the plurality of memories and the fault bit corresponding to the faulty memory; or,
    in a case where the detection strategy is the second detection strategy, performing a sampling detection on storage chips of the each memory to determine the faulty memory from the plurality of memories and the fault bit corresponding to the faulty memory; or, in a case where the detection strategy is the third detection strategy, determining a detection character corresponding to the third detection strategy and a response time corresponding to the third detection strategy, wherein the detection character is configured to be written into the each memory to determine whether each memory has a fault, and the preset response time is the time for writing a character to the each memory; and detecting the each memory according to the detection character and the response time to determine the faulty memory from the plurality of memories and the fault bit corresponding to the faulty memory.

5. The method according to claim 4, wherein the detecting the each memory of the plurality of memories according to the detection strategy for the each memory to determine a faulty memory from the plurality of memories and a fault bit corresponding to the faulty memory, comprises:
    determining first data and second data, wherein the first data and the second data are configured to be written into the each memory, the second data is obtained by performing a bitwise inversion on the first data; and
    determining the faulty memory from the plurality of memories and the fault bit corresponding to the faulty memory according to the first data and the second data.

6. The method according to claim 5, wherein determining the faulty memory from the plurality of memories and the fault bit corresponding to the faulty memory according to the first data and the second data, comprises:
    writing the first data into the each memory, and reading the first data from the each memory after a first preset time to obtain first read data;
    in a case where the first read data corresponding to a first memory from the plurality of memories is different from the first data, determining the first memory as the faulty memory, and determining the fault bit corresponding to the faulty memory according to the first read data;
    in a case where the first data is the same as the first read data, writing the second data into the each memory, and reading the second data from the each memory after a second preset time to obtain second read data; and in a case where the second read data corresponding to a second memory from the plurality of memories is different from the second data, determining the second memory as the faulty memory, and determining the fault bit corresponding to the faulty memory according to the second read data.

7. The method according to claim 2, wherein replacing the fault bit corresponding to the faulty memory with a redundant bit in the faulty memory to repair the faulty memory, comprises:

judging whether the redundant bit exists in the faulty memory; and in a case where the redundant bit exists in the faulty memory, replacing the fault bit corresponding to the faulty memory with the redundant bit in the faulty memory to repair the faulty memory.

8. The method according to claim 7, wherein after judging whether the redundant bit exists in the faulty memory, the method further comprises:

in a case where no redundant bit exists in the faulty memory, indicating that the faulty memory is irreparable.

9. The method according to claim 7, wherein the in a case where the redundant bit exists in the faulty memory, replacing the fault bit corresponding to the faulty memory with the redundant bit in the faulty memory to repair the faulty memory, comprises:

determining whether a memory repair criterion corresponding to the faulty memory exists according to the memory hardware parameter of the faulty memory, wherein the memory repair criterion at least comprises: a number of repair being less than a second preset value and/or a number of repaired bits being less than a third preset value;

in a case where the memory repair criterion corresponding to the faulty memory exists, and the memory repair criterion comprises: a number of repair being less than a second preset value, judging whether the number of repair corresponding to the faulty memory meets the memory repair criterion; and in a case where the number of repair corresponding to the faulty memory meets the memory repair criterion, replacing the fault bit corresponding to the faulty memory with the redundant bit in the faulty memory to repair the faulty memory;

in a case where the memory repair criterion corresponding to the faulty memory exists, and the memory repair criterion comprises: a number of repaired bits being less than a third preset value, judging whether the number of repaired bits corresponding to the faulty memory meets the memory repair criterion; and in a case where the number of repaired bits corresponding to the faulty memory meets the memory repair criterion, replacing the fault bit corresponding to the faulty memory with the redundant bit in the faulty memory to repair the faulty memory;

in a case where the memory repair criterion corresponding to the faulty memory exists, and the memory repair criterion comprises: a number of repair being less than a second preset value and a number of repaired bits being less than a third preset value, judging whether the number of repair and the number of repaired bits corresponding to the faulty memory meet the memory repair criterion; and in a case where the number of repair and the number of repaired bits corresponding to the faulty memory meet the memory repair criterion, replacing the fault bit corresponding to the faulty memory with the redundant bit in the faulty memory to repair the faulty memory.

10. The method according to claim 9, wherein after judging whether the faulty memory meets the memory repair criterion, the method further comprises:

in a case where the memory repair criterion corresponding to the faulty memory exists, and the memory repair criterion comprises: the number of repair being less than the second preset value, and the number of repair corresponding to the faulty memory does not meet the memory repair criterion, indicating that the faulty memory is irreparable; or, in a case where the memory repair criterion corresponding to the faulty memory exists, and the memory repair criterion comprises: the number of repaired bits being less than the third preset value, and the number of repaired bits corresponding to the faulty memory does not meet the memory repair criterion, indicating that the faulty memory is irreparable;

in a case where the memory repair criterion corresponding to the faulty memory exists, and the memory repair criterion comprises: the number of repair being less than the second preset value and the number of repaired bits being less than the third preset value, and the number of repair corresponding to the faulty memory or the number of repaired bits corresponding to the faulty memory does not meet the memory repair criterion, indicating that the faulty memory is irreparable.

11. The method according to claim 9, wherein after replacing the fault bit corresponding to the faulty memory with the redundant bit in the faulty memory to repair the faulty memory, the method further comprises:

determining a faulty memory which is irreparable, a faulty memory which is repaired, and a non-faulty memory in the plurality of memories;

acquiring first data information of the faulty memory which is irreparable, acquiring second data information of the faulty memory which is repaired, and acquiring third data information of the non-faulty memory; and determining memory detecting and repairing results of the target server according to the first data information, the second data information, and the third data information.

12. The method according to claim 11, wherein after determining the memory detecting and repairing results of the target server according to the first data information, the second data information, and the third data information, the method further comprises:

sending the memory detecting and repairing result to the baseboard management controller;

reading the memory detecting and repairing result by the baseboard management controller, and identifying the faulty memory which is irreparable; and sending the faulty memory which is irreparable to a target object to perform replacement processing on the faulty memory which is irreparable by the target object.

13. The method according to claim 12, wherein after sending the faulty memory which is irreparable to the target object, the method further comprises:

storing each of the memory detecting and repairing results into historical data information corresponding to corresponding one memory of the plurality of memories according to the memory hardware parameter of the corresponding one memory.

14. The method according to claim 13, wherein after storing each of the memory detecting and repairing results into historical data information corresponding to corresponding one memory of the plurality of memories, the method further comprises:

determining a health status of each memory according to the historical data information corresponding to the each memory to obtain a determination result; and updating a preset detection strategy for the plurality of memories according to the determination result.

15. The method according to claim 1, wherein before the determining, according to a target flag bit stored in a baseboard management controller, whether to perform a detecting and repairing operation on a plurality of memories of a target server, the method further comprises:

detecting, while the target server is running, whether a memory in the target server reports an error;

in a case where a memory in the target server reports an error, triggering a system management interruption to send data information of the error reported by the memory to the baseboard management controller to configure the target flag bit to be a first preset value by the baseboard management controller; and restarting the target server.

16. The method according to claim 15, wherein the determining, according to a target flag bit stored in a baseboard management controller, whether to perform a detecting and repairing operation on a plurality of memories of a target server, comprises:

reading, by the target server, the target flag bit from the baseboard management controller; and in a case where the target flag bit is the first preset value, determining to perform the detecting and repairing operation on the plurality of memories of the target server.

17. The method according to claim 1, wherein the detection strategy at least comprises:

a first detection strategy, a second detection strategy and a third detection strategy; and the first detection strategy is configured to detect all storage chips of the each memory, the second detection strategy is configured to perform a sampling detection on the storage chips of the each memory, and the third detection strategy is configured to detect the storage chips of the each memory based on a preset detection character and a preset response time.

18. The method according to claim 1, wherein the determining a detection strategy for the each memory according to the memory hardware parameter of the each memory, comprises:

reading, according to the memory hardware parameter of the each memory, historical data information of the each memory stored in the baseboard management controller, wherein the historical data information at least comprises: a runtime duration, a number of repair and a number of repaired bits; and determining the detection strategy for the each memory according to the historical data information of the each memory;

or, reading, according to the memory hardware parameter of the each memory, a preset detection strategy stored in the baseboard management controller, wherein the preset detection strategy is a detection strategy configured based on an intelligent platform management interface instruction; and determining the preset detection strategy as the detection strategy for the each memory.

19. A processor, the processor being configured to run a program, wherein when the program is running, the memory processing method based on a server according to claim 1 is implemented.

20. An electronic device, comprising one or more processors and a storage device, wherein the storage device is configured to store one or more programs, wherein when the one or more programs is executed by the one or more processors, the one or more processors is configured to implement the memory processing method based on a server according to claim 1.

* * * * *